(12) United States Patent
Kishigui et al.

(10) Patent No.: US 12,345,593 B2
(45) Date of Patent: Jul. 1, 2025

(54) PRESSURE SENSOR STRUCTURE, PRESSURE SENSOR DEVICE, AND METHOD OF MANUFACTURING PRESSURE SENSOR STRUCTURE

(71) Applicant: Murata Manufacturing Co., Ltd., Nagaokakyo (JP)

(72) Inventors: Kaoru Kishigui, Nagaokakyo (JP); Koichi Yoshida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 331 days.

(21) Appl. No.: 18/093,354

(22) Filed: Jan. 5, 2023

(65) Prior Publication Data

US 2023/0146158 A1 May 11, 2023

Related U.S. Application Data

(63) Continuation of application No. PCT/JP2021/026151, filed on Jul. 12, 2021.

(30) Foreign Application Priority Data

Jul. 21, 2020 (JP) ................................ 2020-124567

(51) Int. Cl.
*G01N 9/00* (2006.01)
*B81B 7/00* (2006.01)
(Continued)

(52) U.S. Cl.
CPC .......... *G01L 9/0072* (2013.01); *B81B 7/0048* (2013.01); *B81B 7/0058* (2013.01);
(Continued)

(58) Field of Classification Search
CPC ... G01L 9/0072; G01L 9/0073; G01L 9/0075; G01L 19/069; B81B 7/0048;
(Continued)

(56) References Cited

U.S. PATENT DOCUMENTS

| 5,920,015 | A | * | 7/1999 | Hallberg | ............... | G01L 9/0075 |
| | | | | | | 361/283.4 |
| 9,829,405 | B2 | * | 11/2017 | Kuisma | ................. | G01L 9/0072 |

(Continued)

FOREIGN PATENT DOCUMENTS

| JP | 6056244 U1 | 4/1985 |
| JP | S6056244 U | * 4/1985 |

(Continued)

OTHER PUBLICATIONS

International Search Report in PCT/JP2021/026151, mailed Sep. 7, 2021, 4 pages.
(Continued)

*Primary Examiner* — Justin N Olamit
(74) *Attorney, Agent, or Firm* — Keating & Bennett, LLP

(57) ABSTRACT

A pressure sensor structure includes a sensor body including a diaphragm plate that functions as a sense electrode, a base electrode that faces the diaphragm plate, and a sidewall layer maintaining a gap between the diaphragm plate and the base electrode, and a conductive guard substrate to support the sensor body. The sidewall layer includes a guard electrode layer and upper and lower electrically insulating layers to electrically insulate the guard electrode layer. An electrically insulating layer is between the guard substrate and the sensor body to electrically insulate the guard substrate. The guard substrate is electrically connected to the guard electrode layer to function as a guard electrode together with the guard electrode layer.

12 Claims, 20 Drawing Sheets

(51) Int. Cl.
  *B81C 1/00* (2006.01)
  *G01L 9/00* (2006.01)
  *G01L 19/06* (2006.01)

(52) U.S. Cl.
  CPC ........ *B81B 7/0064* (2013.01); *B81C 1/00333* (2013.01); *G01L 19/069* (2013.01); *B81B 2201/0264* (2013.01); *B81B 2203/04* (2013.01); *B81C 2203/0118* (2013.01)

(58) Field of Classification Search
  CPC ............... B81B 7/0058; B81B 7/0064; B81B 2201/0264; B81B 2203/04; B81C 1/00333; B81C 2201/016; B81C 2203/0118
  See application file for complete search history.

(56) References Cited

U.S. PATENT DOCUMENTS

| | | | |
|---|---|---|---|
| 11,237,071 B2* | 2/2022 | Takimoto | G01L 19/146 |
| 2005/0262947 A1 | 12/2005 | Dehe | |
| 2011/0159627 A1 | 6/2011 | Mantravadi et al. | |
| 2014/0150560 A1* | 6/2014 | O'Brien | G01L 1/142 |
| | | | 73/728 |
| 2015/0204744 A1* | 7/2015 | Kuisma | G01L 9/0041 |
| | | | 73/718 |
| 2016/0195567 A1* | 7/2016 | Tanaka | G01P 15/0802 |
| | | | 73/514.32 |

FOREIGN PATENT DOCUMENTS

| | | |
|---|---|---|
| JP | 07049278 A | 2/1995 |
| JP | 10501887 A | 2/1998 |
| JP | 2010139495 A | 6/2010 |
| JP | 2011137818 A | 7/2011 |
| JP | 2015059831 A | 3/2015 |
| JP | 2016125927 A | 7/2016 |
| JP | 2017506329 A | 3/2017 |
| WO | 2015107453 A1 | 7/2015 |

OTHER PUBLICATIONS

Written Opinion in PCT/JP2021/026151, mailed Sep. 7, 2021, 4 pages.

* cited by examiner

PRESSURE SENSOR STRUCTURE, PRESSURE SENSOR DEVICE, AND METHOD OF MANUFACTURING PRESSURE SENSOR STRUCTURE

CROSS REFERENCE TO RELATED APPLICATIONS

This application claims the benefit of priority to Japanese Patent Application No. 2020-124567 filed on Jul. 21, 2020 and is a Continuation application of PCT Application No. PCT/JP2021/026151 filed on Jul. 12, 2021. The entire contents of each application are hereby incorporated herein by reference.

BACKGROUND OF THE INVENTION

1. Field of the Invention

The present invention relates to a pressure sensor structure for measuring pressure such as atmospheric pressure or water pressure and a pressure sensor device including the pressure sensor structure. Further, the present invention relates to a method of manufacturing a pressure sensor structure.

2. Description of the Related Art

Pressure sensors can be manufactured by using microelectromechanical systems (MEMS) technology, which is an applied technology of semiconductor manufacturing technology, and can be implemented as microsensors of approximately 0.5 mm square to approximately 2 mm square, for example. A typical pressure sensor has a capacitor structure including two electrodes and detects a change in electrostatic capacitance due to a change in ambient pressure, thereby being capable of measuring pressure.

FIG. 9A is a sectional view illustrating an example of a related-art pressure sensor structure, and FIG. 9B is a plan view thereof. This pressure sensor structure is disclosed in International Publication No. 2015/107453, for example, and includes a diaphragm plate 87 that functions as a sense electrode, a base electrode 86 facing the diaphragm plate 87, a sidewall layer 85, and the like. The sidewall layer 85 includes a guard electrode layer 83 and electrically insulating layers 82 and 84 disposed on and under the guard electrode layer 83. A base substrate 81 is made of a conductive material and conducted with the base electrode 86. The guard electrode layer 83 is formed in the same layer as the base electrode 86 and sandwiched by the diaphragm plate 87, which is located above the guard electrode layer 83, and the base substrate 81, which is located below the guard electrode layer 83, to form a three-layer electrode structure. With this, stray capacitance unrelated to a pressure change can be canceled.

SUMMARY OF THE INVENTION

Such a pressure sensor structure is obtained as follows: a large number of pressure sensor structures are formed on a single semiconductor wafer by using MEMS technology, and the semiconductor wafer is then cut (singulated) into individual chips. The obtained chip is fixed on a circuit substrate 90 by using an adhesive 91 (chip bonding) and accommodated in a case together with an integrated circuit configured to perform signal processing. A pressure sensor device is complete in this way.

In this case, while the back surface of the base substrate 81 is in close contact with the circuit substrate 90, the end surfaces of the base substrate 81 are exposed. Since the environment surrounding the pressure sensor structure interacts with the atmosphere, a liquid Q such as water may possibly adhere to the end surfaces of the base substrate 81 due to condensation, flooding, or the like. The liquid Q functions as a bridge between the diaphragm plate 87 and the base substrate 81 to change the stray capacitance, resulting in a shift in pressure output value in some cases. Further, the diaphragm plate 87 and the base electrode 86 are affected by electromagnetic noise coming from the outside, resulting in a shift in pressure output value in some cases.

Preferred embodiments of the present invention provide pressure sensor structures each capable of curbing the effects of disturbances and measuring pressure highly precisely, and pressure sensor devices including the pressure sensor structures. Further, other preferred embodiments of the present invention provide methods of manufacturing pressure sensor structures each capable of curbing the effects of disturbances and measuring pressure highly precisely.

An aspect of a preferred embodiment of the present invention is a pressure sensor structure to detect a change in interelectrode electrostatic capacitance, the pressure sensor structure including a sensor body including a diaphragm plate that functions as a sense electrode, a base electrode that faces the diaphragm plate, and a sidewall layer to maintain a gap between the diaphragm plate and the base electrode, and a conductive guard substrate to support the sensor body, wherein the sidewall layer includes a guard electrode layer and upper and lower guard electrode insulating layers to electrically insulate the guard electrode layer, and the guard substrate is electrically connected to the guard electrode layer to function as a guard electrode together with the guard electrode layer.

A pressure sensor device according to another aspect of a preferred embodiment of the present invention includes the above-described pressure sensor structure, an integrated circuit to process a signal from the pressure sensor structure, a circuit substrate on which the integrated circuit and the pressure sensor structure are mounted, and a case made of metal or a synthetic resin to accommodate the integrated circuit and the pressure sensor structure together with the circuit substrate.

Still another aspect of a preferred embodiment of the present invention provides a method of manufacturing a pressure sensor structure to detect a change in interelectrode electrostatic capacitance, the method including forming a lower substrate that includes a base electrode, forming an upper substrate that includes a diaphragm plate that functions as a sense electrode, joining the lower substrate and the upper substrate to each other, shaping the lower substrate and the upper substrate to form a stepped shape, and forming a passivation film on an outer surface of each of the lower substrate and the upper substrate, which have been shaped, wherein the forming the lower substrate includes sequentially forming a lower guard electrode insulating layer and a conductive layer on the lower substrate, which is conductive, and forming a base electrode and a guard electrode layer by etching the conductive layer, and the forming the upper substrate includes forming an electrically insulating layer on the upper substrate, which is conductive, and forming an upper guard electrode insulating layer by etching the electrically insulating layer.

According to preferred embodiments of the present invention, it is possible to curb the effects of disturbances and measure pressure highly precisely.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
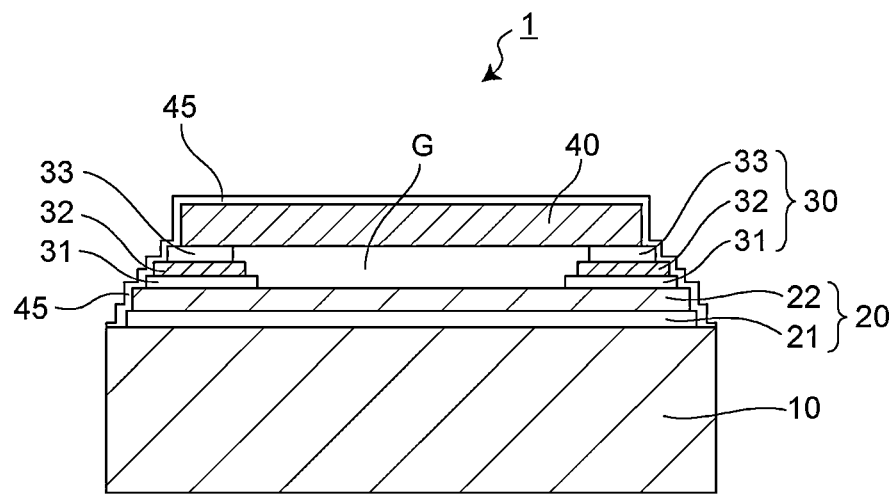
FIG. 1A is a sectional view illustrating an example of a pressure sensor structure according to Preferred Embodiment 1 of the present invention.

An aspect of a preferred embodiment of the present invention provides a pressure sensor structure to detect a change in interelectrode electrostatic capacitance, the pressure sensor structure including a sensor body including a diaphragm plate that functions as a sense electrode, a base electrode that faces the diaphragm plate, and a sidewall layer to maintain a gap between the diaphragm plate and the base electrode; and a conductive guard substrate to support the sensor body, wherein the sidewall layer includes a guard electrode layer and upper and lower guard electrode insulating layers to electrically insulate the guard electrode layer, and the guard substrate is electrically connected to the guard electrode layer to function as a guard electrode together with the guard electrode layer.

With this configuration, the guard substrate is electrically connected to the guard electrode layer to function as a guard electrode. Thus, even when a liquid such as water adheres to the substrate end surface, a shift in pressure output value due to a change in potential of the base electrode can be prevented.

Further, since the guard substrate, which is the bottom layer, functions as a guard electrode, the pressure sensor structure is less affected by electromagnetic noise coming from an electronic circuit under the pressure sensor structure. Thus, a shift in pressure output value due to disturbances can be prevented.

Further, in a state where a large number of pressure sensor structures are on a single wafer substrate, the diaphragm plate and the base electrode included in each of the individual pressure sensor structures are electrically isolated from each other. Thus, the characteristics of the individual chips can be tested before chip cutting.

Preferably, a substrate insulating layer to electrically insulate the guard substrate is provided between the guard substrate and the sensor body.

With this configuration, the guard substrate and the sensor body can be electrically insulated from each other.

Preferably, a passivation film is provided on an outer surface of each of the sensor body and the guard substrate.

With this configuration, even when a liquid such as water adheres to the outer surface of the pressure sensor structure due to condensation, flooding, or the like, the passivation film can curb the effect of the liquid.

Preferably, the base electrode is provided in a same layer as the guard electrode layer and electrically isolated from the guard electrode layer.

With this configuration, an error in the dimension of the gap between the diaphragm plate and the base electrode can be reduced. Further, since the base electrode and the guard electrode layer can be formed by using the same layer formation process, a simplified manufacturing process and reduced cost can be achieved.

Preferably, between the substrate insulating layer and the sensor body, a second base electrode and a second guard electrode layer are provided in a same layer and electrically isolated from each other.

With this configuration, the second guard electrode layer can function as a guard electrode together with the guard electrode layer. Thus, a further enhanced guard electrode function can be provided.

Preferably, at least one of the diaphragm plate, the upper guard electrode insulating layer, the guard electrode layer, the lower guard electrode insulating layer, and the guard substrate has formed therein a groove to relax stress.

With this configuration, stress to be applied to the sensor body and/or the guard substrate is relaxed so that the sensor structure with improved life and reliability can be provided.

Preferably, the lower guard electrode insulating layer, the guard electrode layer, and the upper guard electrode insulating layer have a frame shape along a periphery of the diaphragm plate, and a distance W1 between inner edges of the lower guard electrode insulating layer, a distance W6 between outer edges thereof, a distance W2 between inner edges of the guard electrode layer, a distance W5 between outer edges thereof, a distance W3 between inner edges of the upper guard electrode insulating layer, and a distance W4 between outer edges thereof satisfy W1<W2<W3 and W4<W5<W6.

With this configuration, a larger creepage distance is secured on the outer surface of the sensor body. Thus, the effects of external leakage current and stray capacitance between the diaphragm plate and the base electrode on a pressure output value can be reduced.

Preferably, the lower guard electrode insulating layer has a plate shape larger than a contour of the diaphragm plate, the guard electrode layer and the upper guard electrode insulating layer have a frame shape along a periphery of the diaphragm plate, and a distance W6 between outer edges of the lower guard electrode insulating layer, a distance W2 between inner edges of the guard electrode layer, a distance W5 between outer edges thereof, a distance W3 between inner edges of the upper guard electrode insulating layer, and a distance W4 between outer edges thereof satisfy W2<W3 and W4<W5<W6.

With this configuration, a larger creepage distance is secured on the outer surface of the sensor body so that the effects of external leakage current and stray capacitance between the diaphragm plate and the base electrode on a pressure output value can be reduced.

Preferably, the upper and lower guard electrode insulating layers include silicon dioxide ($SiO_2$) at least in part.

With this configuration, silicon dioxide is obtained by a silicon oxidization process. Thus, a simplified manufacturing process and reduced cost can be achieved.

A pressure sensor device according to another aspect of a preferred embodiment of the present invention includes the above-described pressure sensor structure, an integrated circuit to process a signal from the pressure sensor structure, a circuit substrate on which the integrated circuit and the pressure sensor structure are mounted, and a case made of metal or a synthetic resin to accommodate the integrated circuit and the pressure sensor structure together with the circuit substrate.

With this configuration, the pressure sensor device capable of curbing the effects of disturbances such as condensation, flooding, and electromagnetic noise can be achieved.

Still another aspect of a preferred embodiment of the present invention provides a method of manufacturing a pressure sensor structure to detect a change in interelectrode electrostatic capacitance, the method including forming a lower substrate that includes a base electrode, forming an upper substrate that includes a diaphragm plate that functions as a sense electrode, joining the lower substrate and the upper substrate to each other, shaping the lower substrate and the upper substrate to form a stepped shape, and forming a passivation film on an outer surface of each of the lower substrate and the upper substrate, which have been shaped, wherein the forming the lower substrate includes sequentially forming a lower guard electrode insulating layer and a conductive layer on the lower substrate, which is conductive, and forming a base electrode and a guard electrode layer by etching the conductive layer, and the forming the upper substrate includes forming an electrically insulating layer on the upper substrate, which is conductive, and forming an upper guard electrode insulating layer by etching the electrically insulating layer.

With this configuration, the pressure sensor structure capable of curbing the effects of disturbances such as condensation, flooding, and electromagnetic noise can be achieved.

Preferred Embodiment 1

Figure 1B:
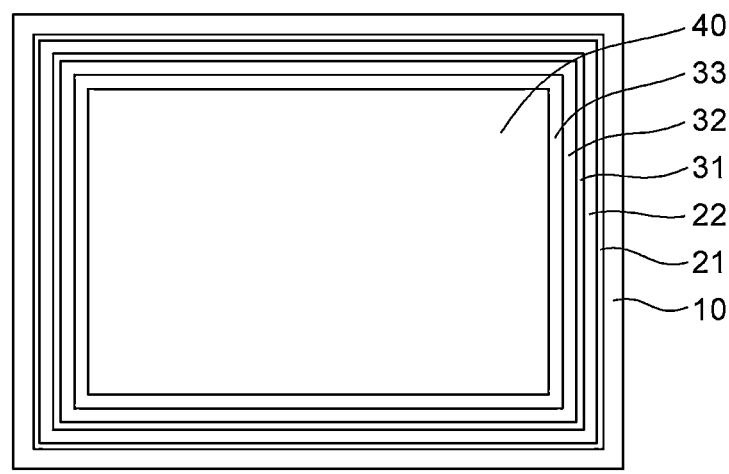
FIG. 1B is a plan view thereof.

FIG. 1A is a sectional view illustrating an example of a pressure sensor structure 1 according to Preferred Embodiment 1 of the present invention, and FIG. 1B is a plan view thereof. To promote a better understanding, the illustration of the passivation film is omitted in FIG. 1B.

This pressure sensor structure 1 includes a sensor body including a diaphragm plate 40, a base electrode 22, and a sidewall layer 30, a guard substrate 10 to support the sensor body, and the like.

The diaphragm plate 40 is made of a conductive material such as polycrystalline Si, amorphous Si, or monocrystalline Si, for example, and functions as a sense electrode deformable depending on an ambient pressure difference. The diaphragm plate 40 can include one or a plurality of layers, and an electrically insulating layer may be provided on the upper surface of the diaphragm plate 40, for example. The base electrode 22 is made of a conductive material such as polycrystalline Si, amorphous Si, or monocrystalline Si, for example, and disposed to face the diaphragm plate 40. The sidewall layer 30 is provided to maintain a gap G between the diaphragm plate 40 and the base electrode 22. The gap G is a space sealed from the outside and maintained at constant pressure with an inert gas filled into the gap G, for example.

The diaphragm plate 40 and the base electrode 22 define a parallel plate capacitor. An electrostatic capacitance C between the electrodes is represented by C=ε×S/d by using a dielectric constant of the gap G, an electrode area S, and an interelectrode distance d. When the diaphragm plate 40 is elastically deformed due to a pressure difference between the outside and the gap G, the interelectrode distance d is changed and the electrostatic capacitance C is accordingly changed.

The sidewall layer 30 is positioned to define a frame surrounding the gap G and includes at least three layers, that is, a guard electrode layer 32, an electrically insulating layer 31 disposed under the guard electrode layer 32, and an electrically insulating layer 33 disposed on the guard electrode layer 32. Here, the three-layer configuration is exemplified, but the sidewall layer 30 may include four or more layers.

The guard substrate 10 is made of a conductive material such as polycrystalline Si, amorphous Si, or monocrystalline Si, for example. The guard substrate 10 can include one or a plurality of layers, and an electrically insulating layer may be provided on the lower surface of the guard substrate 10, for example. An intermediate layer 20 is provided between the guard substrate 10 and the sidewall layer 30. The intermediate layer 20 includes at least two layers, that is, a substrate-side electrically insulating layer 21 and the above-mentioned base electrode 22 located thereon. Here, the two-layer configuration is exemplified, but the intermediate layer 20 may include three or more layers.

The guard electrode layer 32 is interposed between the diaphragm plate 40, which is located above the guard electrode layer 32, and the base electrode 22, which is located below the guard electrode layer 32. With this, stray capacitance unrelated to a pressure change can be canceled.

Further, the guard substrate 10 is electrically connected to the guard electrode layer 32 to function as a guard electrode together with the guard electrode layer 32. The guard substrate 10 and the guard electrode layer 32 may be conducted with each other by a via hole, a wire, or the like in this structure, or may be conducted with each other via an external electronic circuit.

With such a configuration, even when a liquid such as water adheres to the substrate end surface, a shift in pressure output value due to a change in potential of the base electrode can be prevented. Further, since the guard substrate 10, which is the bottom layer, functions as a guard electrode (shield electrode), the pressure sensor structure is less affected by electromagnetic noise coming from an electronic circuit placed under the pressure sensor structure, with the result that a shift in pressure output value can be prevented.

A passivation film 45 is provided on the outer surfaces of the sensor body, the electrically insulating layer 21, and the guard substrate 10. The passivation film 45 is made of an electrically insulating material such as $SiN_x$ or $SiO_2$, for example, and protects the pressure sensor structure 1.

Preferred Embodiment 2

Figure 2A:
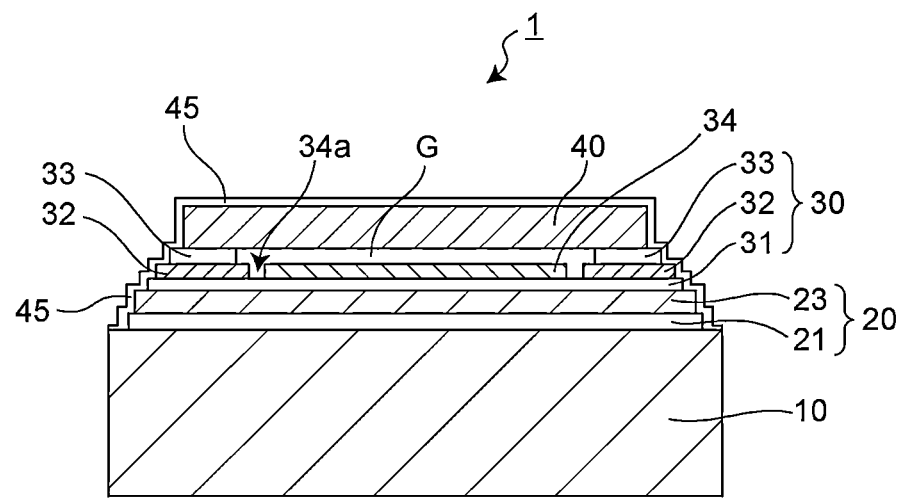
FIG. 2A is a sectional view illustrating an example of a pressure sensor structure according to Preferred Embodiment 2 of the present invention.
Figure 2B:
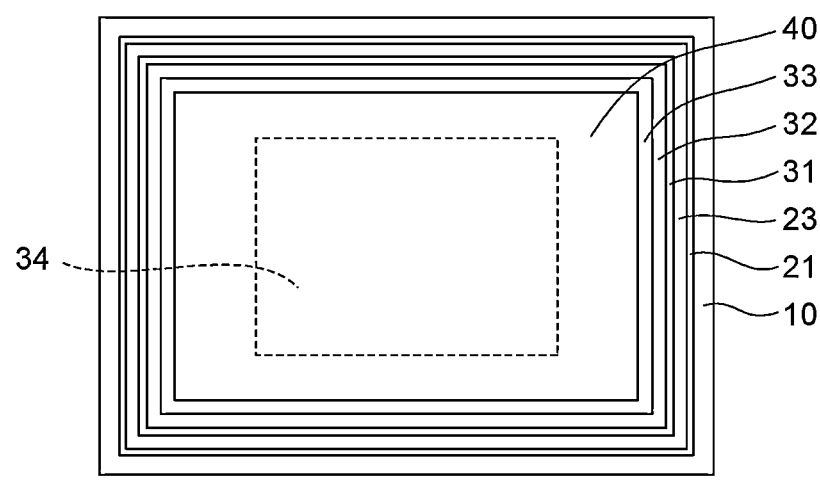
FIG. 2B is a plan view thereof.

FIG. 2A is a sectional view illustrating an example of the pressure sensor structure 1 according to Preferred Embodiment 2 of the present invention, and FIG. 2B is a plan view thereof. To promote a better understanding, the illustration of the passivation film is omitted in FIG. 2B. In the present preferred embodiment, as compared to the configuration of FIGS. 1A and 1B, a base electrode 34 is provided in the same layer as the guard electrode layer 32 instead of the base electrode 22.

This pressure sensor structure 1 includes a sensor body including the diaphragm plate 40, the base electrode 34, and the sidewall layer 30, and the guard substrate 10 configured to support the sensor body.

The diaphragm plate 40 is made of a conductive material such as polycrystalline Si, amorphous Si, or monocrystalline Si, for example, and functions as a sense electrode deformable depending on an ambient pressure difference. The diaphragm plate 40 can include one or a plurality of layers, and an electrically insulating layer may be provided on the upper surface of the diaphragm plate 40, for example. The base electrode 34 is made of a conductive material such as polycrystalline Si, amorphous Si, or monocrystalline Si, for example, and disposed to face the diaphragm plate 40. The sidewall layer 30 is provided to maintain a gap G between the diaphragm plate 40 and the base electrode 34. The gap G is a space sealed from the outside and maintained at constant pressure with an inert gas filled into the gap G, for example. The diaphragm plate 40 and the base electrode 34 define a parallel plate capacitor.

The sidewall layer 30 is positioned to define a frame surrounding the gap G and includes at least three layers, that is, the guard electrode layer 32, the electrically insulating layer 31 disposed under the guard electrode layer 32, and the electrically insulating layer 33 disposed on the guard electrode layer 32. Here, the three-layer configuration is exemplified, but the sidewall layer 30 may include four or more layers.

The base electrode 34 is provided on the electrically insulating layer 31 and in the same layer as the guard electrode layer 32 and electrically isolated from the guard electrode layer 32 with a trench 34a. With such a configuration, the height dimension of the gap G only depends on an error in the thickness of the electrically insulating layer 33 so that the gap G with a greater accuracy than that in the configuration of FIGS. 1A and 1B are obtained. Further, since the base electrode 34 and the guard electrode layer 32 can be formed by using the same layer formation process, a simplified manufacturing process and reduced cost can be achieved.

The guard substrate 10 is made of a conductive material such as polycrystalline Si, amorphous Si, or monocrystalline Si, for example. The guard substrate 10 can include one or a plurality of layers, and an electrically insulating layer may be provided on the lower surface of the guard substrate 10, for example. The intermediate layer 20 is provided between the guard substrate 10 and the sidewall layer 30. The intermediate layer 20 includes at least two layers, that is, the substrate-side electrically insulating layer 21 and a base conductive layer 23 located thereon. The base conductive layer 23 is electrically connected to the base electrode 34. Here, the two-layer configuration is exemplified, but the intermediate layer 20 may include three or more layers.

The guard electrode layer 32 is interposed between the diaphragm plate 40, which is located above the guard electrode layer 32, and the base conductive layer 23, which is located below the guard electrode layer 32. With this, stray capacitance unrelated to a pressure change can be canceled.

Further, the guard substrate 10 is electrically connected to the guard electrode layer 32 to function as a guard electrode together with the guard electrode layer 32. The substrate 10 and the guard electrode layer 32 may be conducted with each other by a via hole, a wire, or the like in this structure, or may be conducted with each other via an external electronic circuit.

With such a configuration, even when a liquid such as water adheres to the substrate end surface, a shift in pressure output value due to a change in potential of the base electrode can be prevented. Further, since the guard substrate 10, which is the bottom layer, functions as a guard electrode (shield electrode), the pressure sensor structure is less affected by electromagnetic noise coming from an electronic circuit placed under the pressure sensor structure, with the result that a shift in pressure output value can be prevented.

The passivation film 45 is provided on the outer surfaces of the sensor body, the base conductive layer 23, the electrically insulating layer 21, and the guard substrate 10. The passivation film 45 is made of an electrically insulating material such as $SiN_x$ or $SiO_2$, for example, and protects the pressure sensor structure 1.

Preferred Embodiment 3

Figure 3:
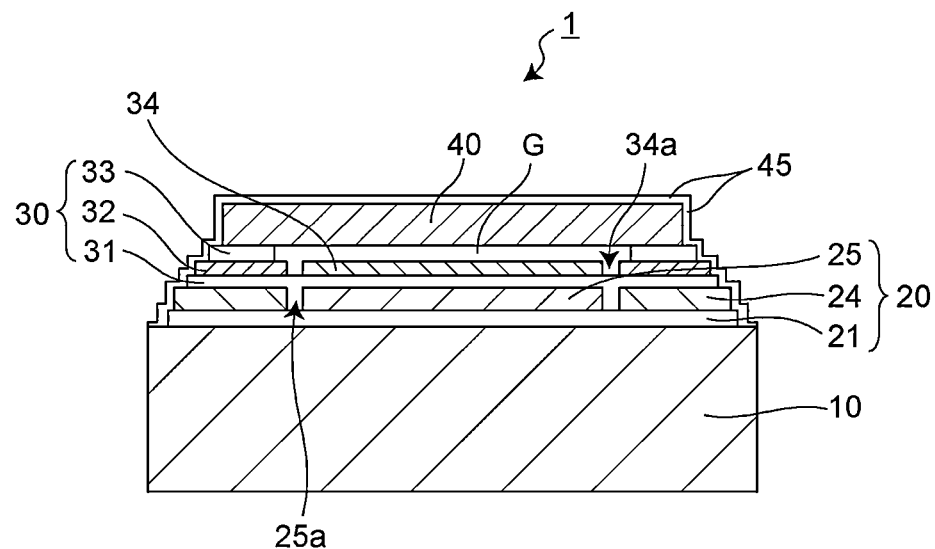
FIG. 3 is a sectional view illustrating an example of a pressure sensor structure according to Preferred Embodiment 3 of the present invention.

FIG. 3 is a sectional view illustrating an example of the pressure sensor structure 1 according to Preferred Embodiment 3 of the present invention. In the present preferred embodiment, as compared to the configuration of FIGS. 2A and 2B, a second base electrode 25 and a second guard electrode layer 24 are provided in the same layer instead of the base conductive layer 23.

This pressure sensor structure 1 includes a sensor body including the diaphragm plate 40, the base electrode 34, and the sidewall layer 30, and the guard substrate 10 configured to support the sensor body.

The diaphragm plate 40 is made of a conductive material such as polycrystalline Si, amorphous Si, or monocrystalline Si, for example, and functions as a sense electrode deformable depending on an ambient pressure difference. The diaphragm plate 40 can include one or a plurality of layers, and an electrically insulating layer may be provided on the upper surface of the diaphragm plate 40, for example. The base electrode 34 is made of a conductive material such as polycrystalline Si, amorphous Si, or monocrystalline Si, for example, and disposed to face the diaphragm plate 40. The sidewall layer 30 is provided to maintain the gap G between the diaphragm plate 40 and the base electrode 34. The gap G is a space sealed from the outside and maintained at constant pressure with an inert gas filled into the gap G, for example. The diaphragm plate 40 and the base electrode 34 form a parallel plate capacitor.

The sidewall layer 30 is positioned to define a frame surrounding the gap G and includes at least three layers, that is, the guard electrode layer 32, the electrically insulating layer 31 disposed under the guard electrode layer 32, and the electrically insulating layer 33 disposed on the guard electrode layer 32. Here, the three-layer configuration is exemplified, but the sidewall layer 30 may include four or more layers.

The base electrode 34 is provided on the electrically insulating layer 31 and in the same layer as the guard electrode layer 32 and electrically isolated from the guard electrode layer 32 with the trench 34a. With such a configuration, the height dimension of the gap G only depends on an error in the thickness of the electrically insulating layer 33 so that the gap G with a greater accuracy than that in the configuration of FIGS. 1A and 1B are obtained. Further, since the base electrode 34 and the guard electrode layer 32 can be formed by using the same layer formation process, a simplified manufacturing process and reduced cost can be achieved.

The guard substrate 10 is made of a conductive material such as polycrystalline Si, amorphous Si, or monocrystalline Si, for example. The guard substrate 10 can include one or a plurality of layers, and an electrically insulating layer may be provided on the lower surface of the guard substrate 10, for example. The intermediate layer 20 is provided between the guard substrate 10 and the sidewall layer 30. The intermediate layer 20 includes at least two layers, that is, the substrate-side electrically insulating layer 21 and the second base electrode 25 and the second guard electrode layer 24 that are located thereon. Here, the two-layer configuration is exemplified, but the intermediate layer 20 may include three or more layers. The second base electrode 25 and the second guard electrode layer 24 are provided in the same layer and electrically isolated from each other with a trench 25a. The second base electrode 25 is electrically connected to the base electrode 34. Further, the second guard electrode layer 24 is electrically connected to the guard electrode layer 32.

The guard electrode layer 32 and the second guard electrode layer 24 are interposed between the diaphragm plate 40, which is located above the guard electrode layer 32 and the second guard electrode layer 24, and the guard substrate 10, which is located below the guard electrode layer 32 and the second guard electrode layer 24. With this, stray capacitance unrelated to a pressure change can be canceled.

Further, the guard substrate 10 is electrically connected to the guard electrode layer 32 to function as a guard electrode together with the guard electrode layer 32. The substrate 10 and the guard electrode layer 32 may be conducted with each other by a via hole, a wire, or the like in this structure, or may be conducted with each other via an external electronic circuit.

With such a configuration, even when a liquid such as water adheres to the substrate end surface, a shift in pressure output value due to a change in potential of the base electrode can be prevented. Further, since the guard substrate 10, which is the bottom layer, functions as a guard electrode (shield electrode), the pressure sensor structure is less affected by electromagnetic noise coming from an electronic circuit placed under the pressure sensor structure, with the result that a shift in pressure output value can be prevented.

Further, the second guard electrode layer 24 is electrically connected to the guard electrode layer 32 to function as a guard electrode together with the guard electrode layer 32. Thus, a further enhanced guard electrode function can be provided.

The passivation film 45 is provided on the outer surfaces of the sensor body, the second guard electrode layer 24, the electrically insulating layer 21, and the guard substrate 10. The passivation film 45 is made of an electrically insulating material such as $SiN_x$ or $SiO_2$, for example, and protects the pressure sensor structure 1.

Preferred Embodiment 4

Figure 4:
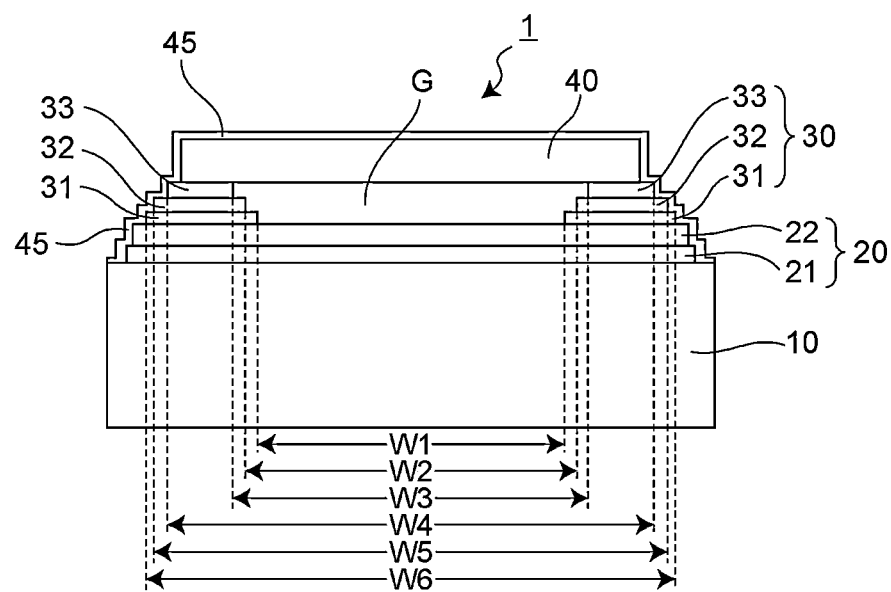
FIG. 4 is a sectional view illustrating an example of a pressure sensor structure according to Preferred Embodiment 4 of the present invention.

FIG. 4 is a sectional view illustrating an example of the pressure sensor structure 1 according to Preferred Embodiment 4 of the present invention. In the present preferred embodiment, the optimization of the width dimension of the sidewall layer 30 is described. In the pressure sensor structure 1 illustrated in FIGS. 1A and 1B, the electrically insulating layer 31, which is the lower layer, the guard electrode layer 32, and the electrically insulating layer 33, which is the upper layer, of the sidewall layer 30 define a frame shape along the periphery of the diaphragm plate 40 and form the cross-sectional shape of a so-called step pyramid structure.

Specifically, a distance W1 between the inner edges of the electrically insulating layer 31, a distance W6 between the outer edges thereof, a distance W2 between the inner edges of the guard electrode layer 32, a distance W5 between the outer edges thereof, a distance W3 between the inner edges of the electrically insulating layer 33, and a distance W4 between the outer edges thereof preferably satisfy the following expression:

$$W1<W2<W3 \text{ and } W4<W5<W6.$$

As concrete numerical examples, W1, W2, and W3 may be within the range of from approximately 20 μm to approximately 500 μm, and W4, W5, and W6 may be within the range of from approximately 50 μm to approximately 1000 μm. The area of the diaphragm plate 40 may be within the range of from approximately 0.5 mm$^2$ to approximately 2 mm$^2$. Further, the thickness of the diaphragm plate 40 may be within the range of from approximately 0.5 μm to approximately 10 μm. The thicknesses of the electrically insulating layers and the conductive layer may be within the range of from approximately 0.1 μm to approximately 1 μm. The thickness of the guard substrate 10 may be within the range of from approximately 100 μm to approximately 825 μm.

With such a configuration, a larger creepage distance is secured on the outer surface of the sensor body. Thus, the effects of external leakage current and stray capacitance between the diaphragm plate 40 and the base electrode 22 on a pressure output value can be reduced.

Preferred Embodiment 5

Figure 5:
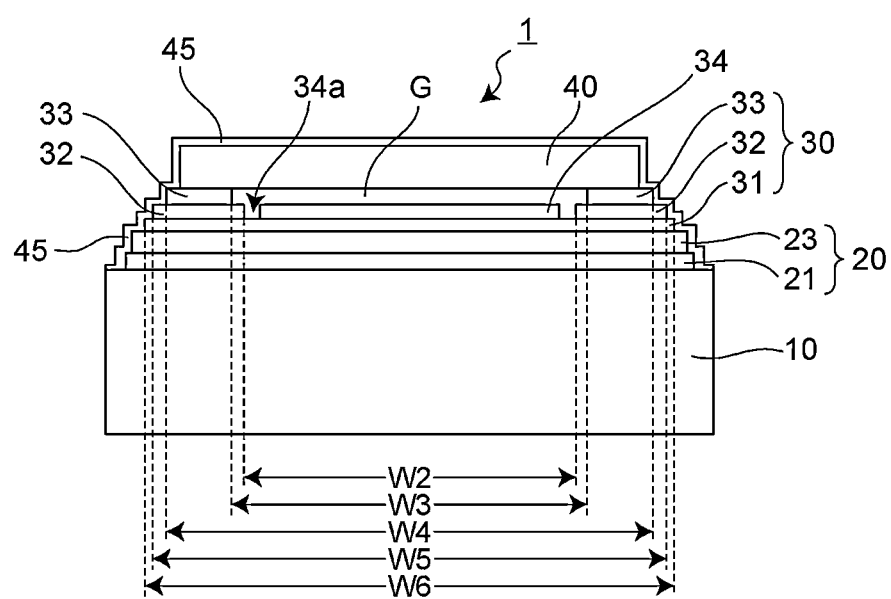
FIG. 5 is a sectional view illustrating an example of a pressure sensor structure according to Preferred Embodiment 5 of the present invention.

FIG. 5 is a sectional view illustrating an example of the pressure sensor structure 1 according to Preferred Embodiment 5 of the present invention. In the present preferred embodiment, the optimization of the width dimension of the sidewall layer 30 is described. In the pressure sensor structure 1 illustrated in FIGS. 2A and 2B, the electrically insulating layer 31, which is the lower layer, of the sidewall layer 30 preferably has a plate shape larger than the contour of the diaphragm plate 40. The guard electrode layer 32 and the electrically insulating layer 33, which is the upper layer, of the sidewall layer 30 define a frame shape along the periphery of the diaphragm plate 40 and form the cross-sectional shape of a so-called step pyramid structure.

Specifically, a distance W6 between the outer edges of the electrically insulating layer 31, a distance W2 between the inner edges of the guard electrode layer 32, a distance W5 between the outer edges thereof, a distance W3 between the inner edges of the electrically insulating layer 33, and a distance W4 between the outer edges thereof preferably satisfy the following expression:

$$W2<W3 \text{ and } W4<W5<W6.$$

With such a configuration, a larger creepage distance is secured on the outer surface of the sensor body. Thus, the effects of external leakage current and stray capacitance between the diaphragm plate 40 and the base electrode 34 on a pressure output value can be reduced.

Preferred Embodiment 6

Figure 6A:
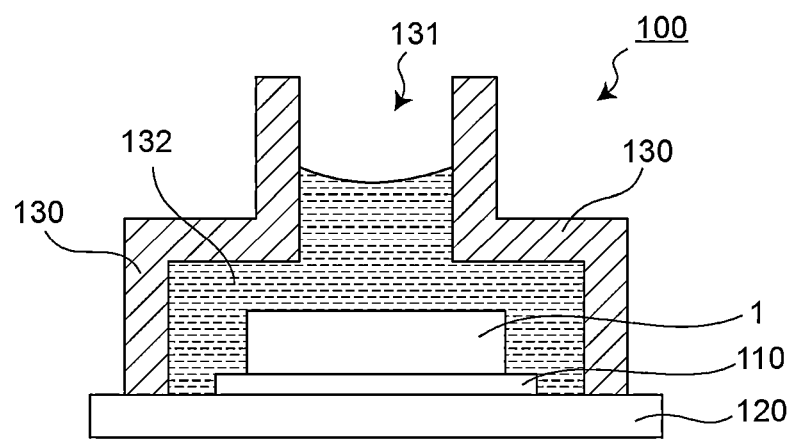
FIGS. 6A to 6C are sectional views illustrating various examples of a pressure sensor device according to Preferred Embodiment 6 of the present invention.
Figure 6B:
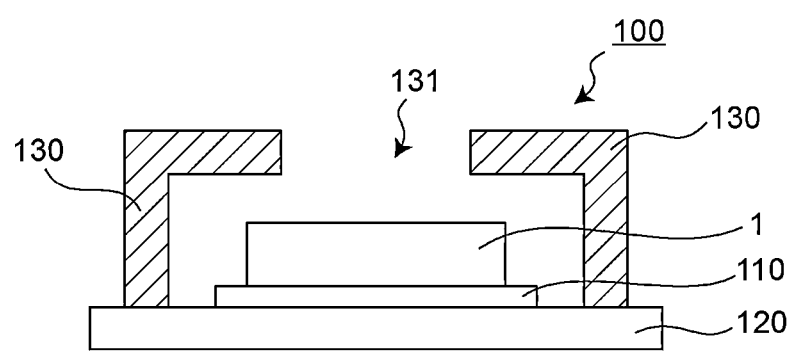
Figure 6C:
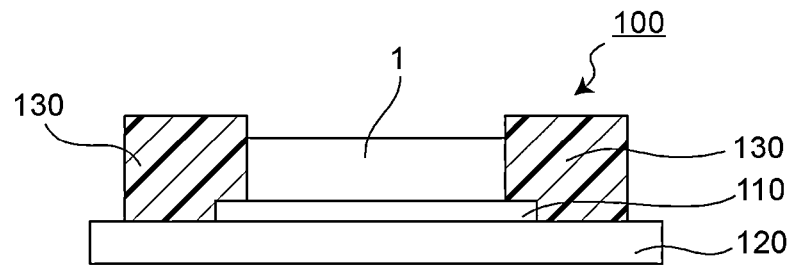

FIG. 6A to FIG. 6C are sectional views illustrating various examples of a pressure sensor device 100 according to Preferred Embodiment 6 of the present invention.

The pressure sensor device 100 includes the pressure sensor structure 1 described above, an integrated circuit 110, a circuit substrate 120, a case 130, and the like. The integrated circuit 110 includes an ASIC, an FPGA, a PLD, a CPLD, or the like and has the function of processing a signal from the pressure sensor structure 1. The integrated circuit 110 is electrically connected to the pressure sensor structure 1 through a terminal provided on the upper surface of the integrated circuit 110. The integrated circuit 110 is electrically connected to a conductor of the circuit substrate 120 through a terminal provided on the lower surface of the integrated circuit 110. The integrated circuit 110 may be electrically connected to the pressure sensor structure 1 with the circuit substrate 120 interposed therebetween. Further, the integrated circuit 110 may be electrically connected to the circuit substrate 120 through a terminal provided on the upper surface of the integrated circuit 110 by a wire or the like.

The circuit substrate 120 has the function of allowing the integrated circuit 110 and the pressure sensor structure 1 to be mounted thereon and includes the conductor for an electrical connection with an external circuit.

The case 130 is made of metal or a synthetic resin, for example, and accommodates the circuit substrate 120, the integrated circuit 111, and the pressure sensor structure 1.

In the example illustrated in FIG. 6A, the case 130 preferably has a stepped cylindrical shape and is fixed to the circuit substrate 120. An opening 131 for interaction with the atmosphere is provided in the upper portion of the case 130. The space inside the case 130 may be filled with the air or a gel 132 as illustrated in the drawing. The gel 132 can enhance the waterproof property, water-resistant property, anticorrosion property, and the like of the pressure sensor structure 1.

In the example illustrated in FIG. 6B, the case 130 preferably has a hollow cylindrical shape, a hollow prismatic shape, a hollow rectangular parallelepiped shape, or the like and mounted on the circuit substrate 120. The opening 131 for interaction with the atmosphere is provided in the upper portion of the case 130.

In the example illustrated in FIG. 6C, the case 130 preferably has a rectangular frame shape, a cylindrical frame shape, or the like and is resin-molded to be in close contact with the side surfaces of the pressure sensor structure 1 and the circuit substrate 120. However, when the case 130 is made of a synthetic resin, the case 130 may possibly absorb water. In this case, the end portion of the pressure sensor structure 1 and the water may possibly be electrically conducted with each other to increase the parasitic capacitance between the sense potential in contact with the case 130, which has absorbed the water, and the base potential, resulting in variations in characteristics. In this case, in the related-art pressure sensor structure, the characteristics may possibly vary since the base electrode is exposed. In a pressure sensor structure according to a preferred embodiment of the present invention, however, variations in characteristics can be prevented since the base electrode is not exposed.

Preferred Embodiment 7

FIGS. 7A to 7F and FIGS. 8A to 8E are explanatory diagrams illustrating an example of a method of manufacturing a pressure sensor structure according to Preferred Embodiment 7 of the present invention. Here, the case of completing the pressure sensor structure 1 illustrated in FIGS. 2A and 2B is exemplified, but the same holds true for the pressure sensor structure 1 illustrated in FIGS. 1A and 1B or FIG. 3.

Figure 7A:
FIGS. 7A to 7F are explanatory diagrams illustrating an example of a method of manufacturing a pressure sensor structure according to Preferred Embodiment 7 of the present invention.

First, the lower substrate of the pressure sensor structure 1 is described. As illustrated in FIG. 7A, a conductive wafer substrate 50, such as Si, is prepared, and an electrically insulating layer 51, such as $SiO_2$, is subsequently formed on the wafer substrate 50 by oxidation treatment. The wafer substrate 50 and the electrically insulating layer 51 correspond to the guard substrate 10 and the electrically insulating layer 21 illustrated in FIGS. 2A and 2B, respectively.

Figure 7B:
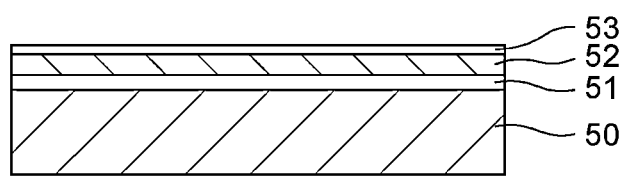

Next, as illustrated in FIG. 7B, a conductive layer 52, such as polycrystalline Si, is formed by using sputtering, and an electrically insulating layer 53, such as $SiO_2$, is subsequently formed on the conductive layer 52 by oxidation treatment. The conductive layer 52 and the electrically insulating layer 53 correspond to the base conductive layer 23 and the electrically insulating layer 31 illustrated in FIGS. 2A and 2B, respectively. Subsequently, the electrically insulating layer 53 is processed into a desired pattern by using photolithography and etching, and at this time, for example, a via hole is formed.

Figure 7C:
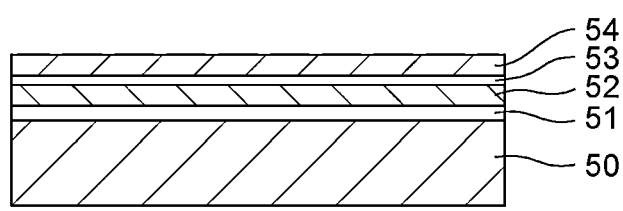

Next, as illustrated in FIG. 7C, a conductive layer 54, such as polycrystalline Si, is formed by using sputtering. At this time, the conductive layer 54 is in conduction with the conductive layer 52 through the via hole. Subsequently, as needed, the conductive layer 54 may be subjected to mirror polishing.

Figure 7D:
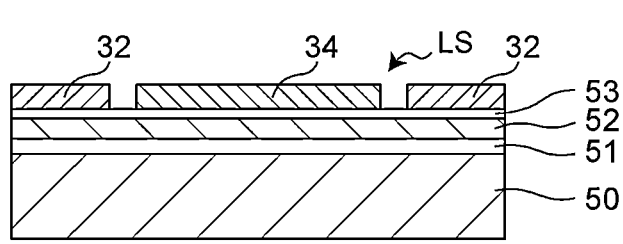

Next, as illustrated in FIG. 7D, the conductive layer 54 is processed into a desired pattern by using photolithography and etching to form the guard electrode layer 32 and the base electrode 34 illustrated in FIGS. 2A and 2B. In this way, a lower substrate LS of the pressure sensor structure 1 is obtained.

Figure 7E:
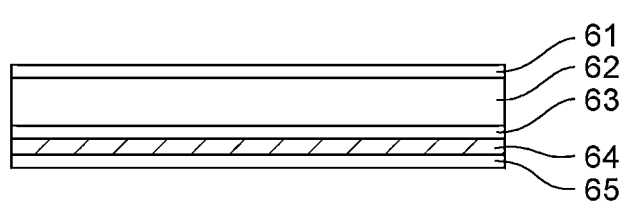

Next, the upper substrate of the pressure sensor structure 1 is described. As illustrated in FIG. 7E, by using a silicon on insulator (SOI) substrate having a three-layer structure including Si, $SiO_2$, and Si, for example, a three-layer structure including a conductive layer 62, an electrically insulating layer 63, and a conductive layer 64 is prepared. Subsequently, by oxidation treatment, an electrically insulating layer 61, such as $SiO_2$, is formed on the surface of the conductive layer 62 and an electrically insulating layer 65, such as $SiO_2$, is formed on the surface of the conductive layer 64.

Figure 7F:
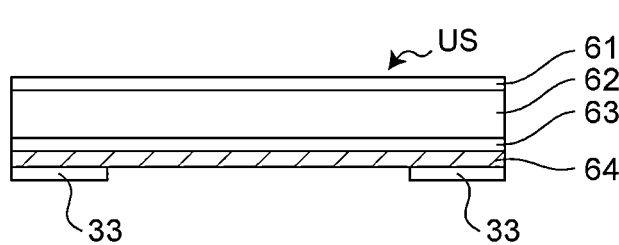

Next, as illustrated in FIG. 7F, the electrically insulating layer 65 is processed into a desired pattern by using photolithography and etching to form the electrically insulating layer 33 illustrated in FIGS. 2A and 2B. In this way, an upper substrate US of the pressure sensor structure 1 is obtained.

Figure 8A:
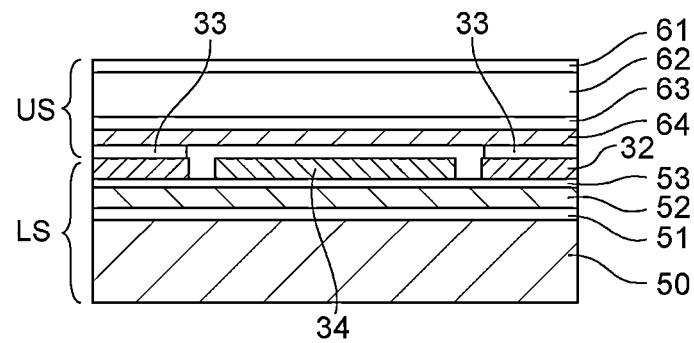
FIGS. 8A to 8E are explanatory diagrams illustrating the example of the method of manufacturing a pressure sensor structure according to Preferred Embodiment 7 of the present invention.
Figure 8B:
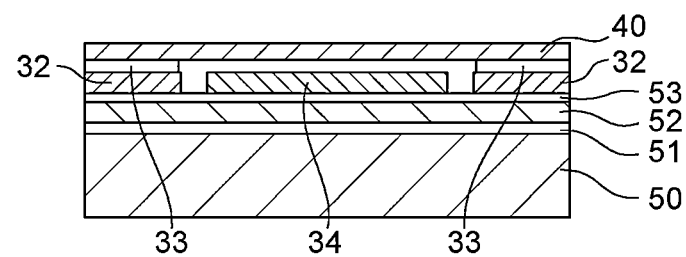

Next, as illustrated in FIG. 8A, the upper substrate US is mounted on the lower substrate LS to be joined thereto by using an adhesive or the like. Next, as illustrated in FIG. 8B, the upper substrate US is thinned by polishing until the electrically insulating layer 61, the conductive layer 62, and the electrically insulating layer 63 are removed and the conductive layer 64 is exposed. The conductive layer 64 corresponds to the diaphragm plate 40 illustrated in FIGS. 2A and 2B.

Figure 8C:
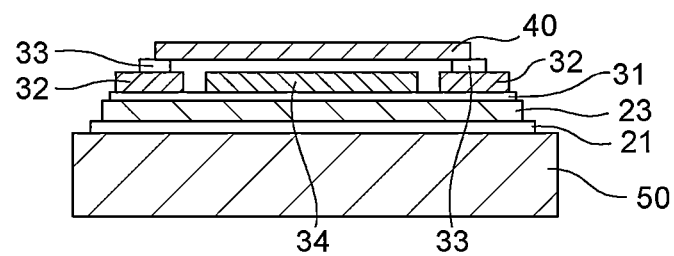

Next, as illustrated in FIG. 8C, by using photolithography and etching, the respective layers located above the wafer substrate 50 are shaped to form a step pyramid shape. In this way, the electrically insulating layer 21, the base conductive layer 23, the electrically insulating layer 31, the guard electrode layer 32, the electrically insulating layer 33, and the diaphragm plate 40, which are illustrated in FIGS. 2A and 2B, are complete. Subsequently, by using sputtering, photolithography, and etching, a first electrode pattern is formed to be conducted with the diaphragm plate 40 and a second electrode pattern is formed to be conducted with the base electrode 34 and the base conductive layer 23. The main components of the electrode patterns are Al or Au.

In this way, a large number of pressure sensor structures are formed on the single wafer substrate 50. In this state, the diaphragm plate 40 and the base electrode 34 included in each of the individual pressure sensor structures are electrically isolated from each other. Thus, the characteristics of the individual chips can be tested by using a wafer prober before chip cutting.

Figure 8D:
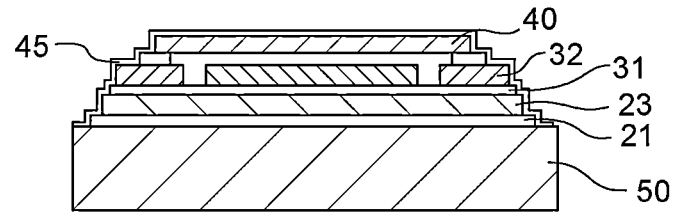

Next, as illustrated in FIG. 8D, by using sputtering, for example, the passivation film 45, such as $SiN_x$ or $SiO_2$, is formed on the surfaces and end surfaces of the layers from the diaphragm plate 40 to the electrically insulating layer 21 and the upper surface of the wafer substrate 50. Subsequently, the passivation film 45 is processed into a desired pattern by using etching.

Figure 8E:
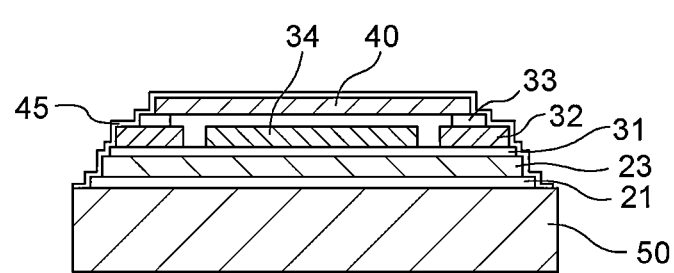

Next, as illustrated in FIG. 8E, the wafer substrate 50 is cut (singulated) into the individual chips with a dicing machine. The wafer substrate 50 corresponds to the guard substrate 10 illustrated in FIGS. 2A and 2B.

In this way, the pressure sensor structure 1 as illustrated in FIGS. 2A and 2B, which is capable of curbing the effects of disturbances such as condensation, flooding, and electromagnetic noise, can be achieved.

Preferred Embodiment 8

Figure 9A:
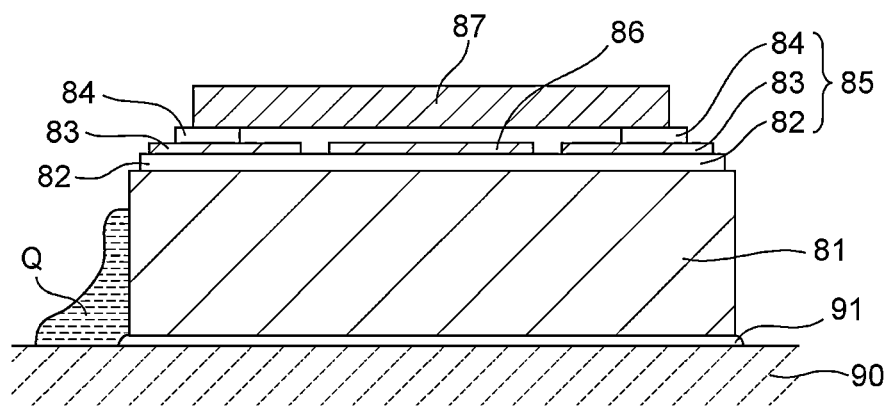
FIG. 9A is a sectional view illustrating an example of a related-art pressure sensor structure.
Figure 9B:
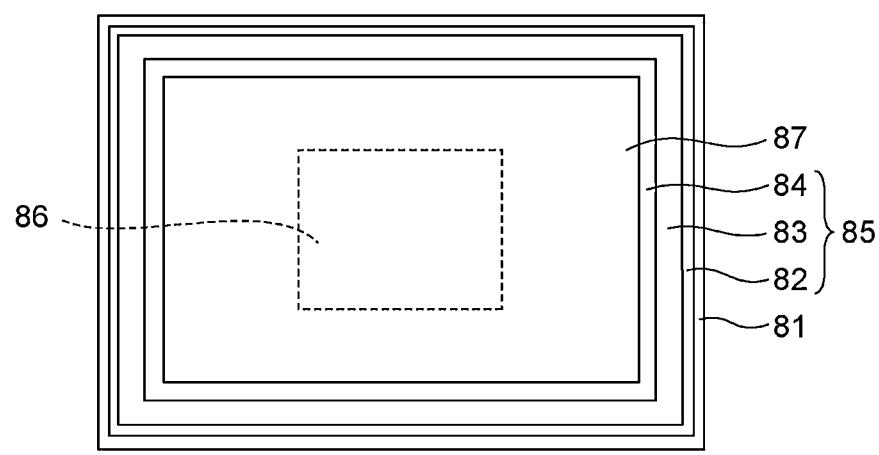
FIG. 9B is a plan view thereof.
Figure 10:
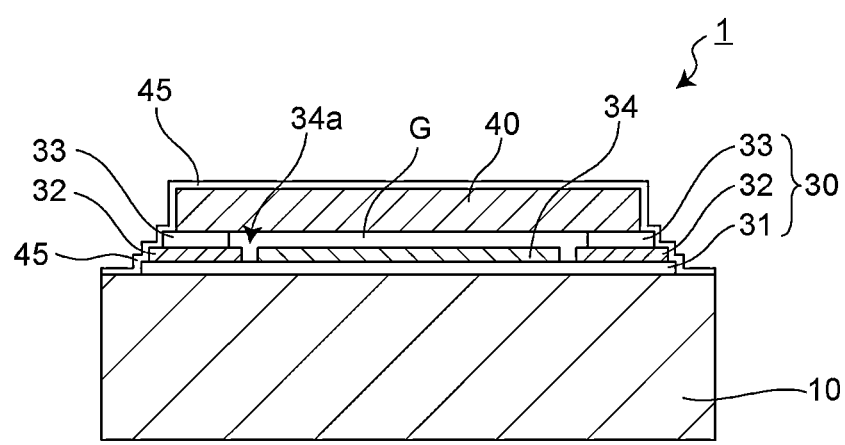
FIG. 10 is a sectional view illustrating an example of a pressure sensor structure according to Preferred Embodiment 8 of the present invention.

FIG. 10 is a sectional view illustrating an example of the pressure sensor structure 1 according to Preferred Embodiment 8 of the present invention. The present preferred embodiment is similar to the structure illustrated in FIGS. 9A and 9B but different from the structure illustrated in FIGS. 9A and 9B in that the guard substrate 10 is the bottom layer.

This pressure sensor structure 1 includes a sensor body including the diaphragm plate 40, the base electrode 34, and the sidewall layer 30, and the guard substrate 10 to support the sensor body.

The diaphragm plate 40 is made of a conductive material such as polycrystalline Si, amorphous Si, or monocrystalline Si, for example, and functions as a sense electrode deformable depending on an ambient pressure difference. The diaphragm plate 40 can include one or a plurality of layers, and an electrically insulating layer may be provided on the upper surface of the diaphragm plate 40, for example. The base electrode 34 is made of a conductive material such as polycrystalline Si, amorphous Si, or monocrystalline Si, for example, and disposed to face the diaphragm plate 40. The sidewall layer 30 is provided to maintain the gap G between the diaphragm plate 40 and the base electrode 34. The gap G is a space sealed from the outside and maintained at constant pressure with an inert gas filled into the gap G, for example. The diaphragm plate 40 and the base electrode 34 define a parallel plate capacitor.

The sidewall layer 30 is positioned to define a frame surrounding the gap G and includes at least three layers, that is, the guard electrode layer 32, the electrically insulating layer 31 disposed under the guard electrode layer 32, and the electrically insulating layer 33 disposed on the guard electrode layer 32. Here, the three-layer configuration is exemplified, but the sidewall layer 30 may include four or more layers.

The base electrode 34 is provided on the electrically insulating layer 31 and in the same layer as the guard electrode layer 32 and electrically isolated from the guard electrode layer 32 with the trench 34a. With such a configuration, the height dimension of the gap G only depends on an error in the thickness of the electrically insulating layer 33 so that the gap G with a greater accuracy than that in the configuration of FIG. 1 is obtained. Further, since the base electrode 34 and the guard electrode layer 32 can be formed by using the same layer formation process, a simplified manufacturing process and reduced cost can be achieved.

The guard substrate 10 is made of a conductive material such as polycrystalline Si, amorphous Si, or monocrystalline Si, for example. The guard substrate 10 can include one or a plurality of layers, and an electrically insulating layer may be provided on the lower surface of the guard substrate 10, for example. The intermediate layer 20 is provided between the guard substrate 10 and the sidewall layer 30. The intermediate layer 20 includes at least two layers, that is, the substrate-side electrically insulating layer 21 and the base conductive layer 23 located thereon. The base conductive layer 23 is electrically connected to the base electrode 34. Here, the two-layer configuration is exemplified, but the intermediate layer 20 may include three or more layers.

Further, the guard substrate 10 is electrically connected to the guard electrode layer 32 to function as a guard electrode together with the guard electrode layer 32. The substrate 10 and the guard electrode layer 32 may be conducted with each other by a via hole, a wire, or the like in this structure, or may be conducted with each other via an external electronic circuit.

With such a configuration, even when a liquid such as water adheres to the substrate end surface, a shift in pressure output value due to a change in potential of the base electrode can be prevented. Further, since the guard substrate 10, which is the bottom layer, functions as a guard electrode (shield electrode), the pressure sensor structure is less affected by electromagnetic noise coming from an electronic circuit placed under the pressure sensor structure, with the result that a shift in pressure output value can be prevented.

The passivation film 45 is provided on the outer surfaces of the sensor body and the guard substrate 10. The passivation film 45 is made of an electrically insulating material such as $SiN_x$ or $SiO_2$, for example, and protects the pressure sensor structure 1.

Preferred Embodiment 9

Figure 11:
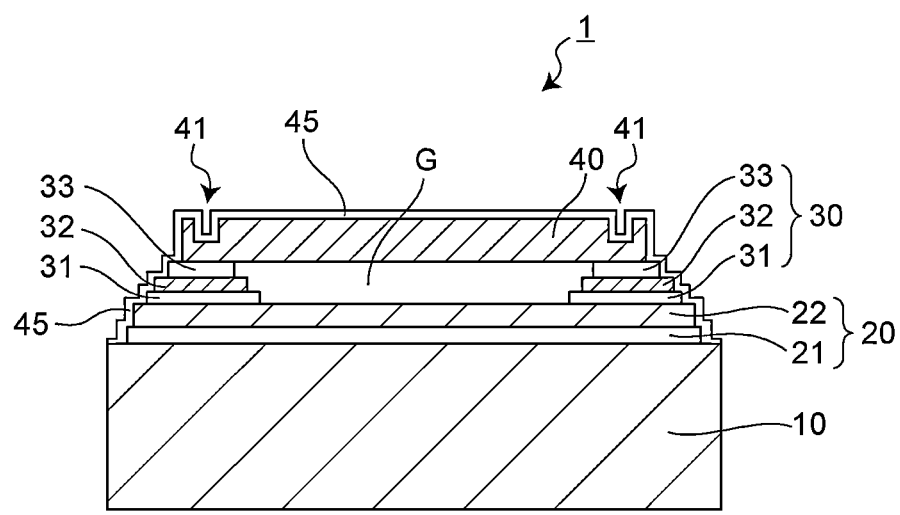
FIG. 11 is a sectional view illustrating an example of a pressure sensor structure according to Preferred Embodiment 9 of the present invention.

FIG. 11 is a sectional view illustrating an example of the pressure sensor structure 1 according to Preferred Embodiment 9 of the present invention. The present preferred embodiment is similar to the structure illustrated in FIG. 1. In present preferred embodiment, however, at a location on the inner side of the edges of the diaphragm plate 40, for example, above the location of the sidewall layer 30, a groove 41 with a depth equivalent to about half the thickness of the diaphragm plate 40 is formed. With this, stress to be applied to the diaphragm plate 40 can be relaxed.

Preferred Embodiment 10

Figure 12:
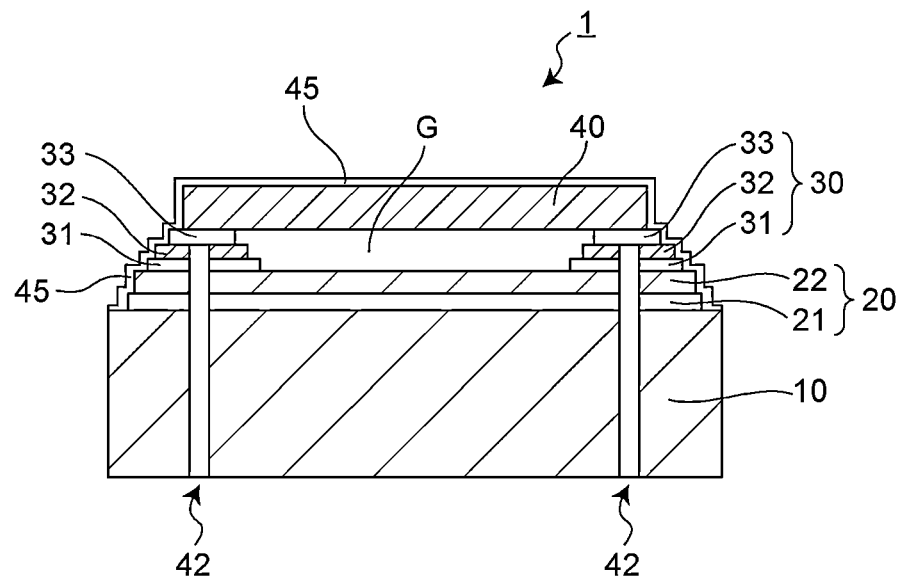
FIG. 12 is a sectional view illustrating an example of a pressure sensor structure according to Preferred Embodiment 10 of the present invention.

FIG. 12 is a sectional view illustrating an example of the pressure sensor structure 1 according to Preferred Embodiment 10 of the present invention. The present preferred embodiment is similar to the structure illustrated in FIG. 1. In the present preferred embodiment, however, at a location on the inner side of the edges of the guard substrate 10, for example, under the location of the sidewall layer 30, a groove 42 reaching the back surface of the guard substrate 10 is provided. With this, stress to be applied to the guard substrate 10 can be relaxed.

As an alternative example, the groove 42 may be provided in at least one of the guard substrate 10, the electrically insulating layer 21, the base electrode 22, the electrically insulating layer 31, the guard electrode layer 32, the electrically insulating layer 33, and the diaphragm plate 40. The groove 42 may, but not necessarily, be exposed to the outside.

Preferred Embodiment 11

Figure 13:
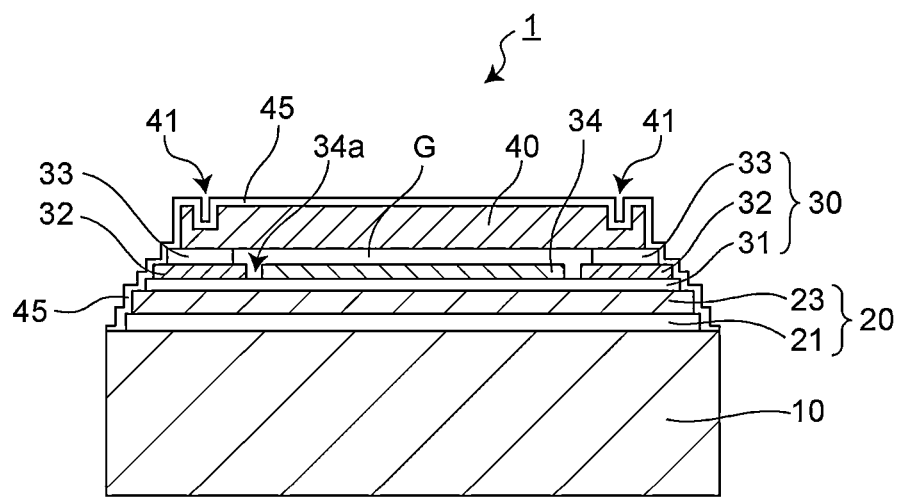
FIG. 13 is a sectional view illustrating an example of a pressure sensor structure according to Preferred Embodiment 11 of the present invention.

FIG. 13 is a sectional view illustrating an example of the pressure sensor structure 1 according to Preferred Embodiment 11 of the present invention. The present preferred embodiment is similar to the structure illustrated in FIGS. 2A and 2B. In present preferred embodiment, however, at a location on the inner side of the edges of the diaphragm plate 40, for example, above the location of the sidewall layer 30, the groove 41 with a depth equivalent to about half the thickness of the diaphragm plate 40 is formed. With this, stress to be applied to the diaphragm plate 40 can be relaxed.

Preferred Embodiment 12

Figure 14:
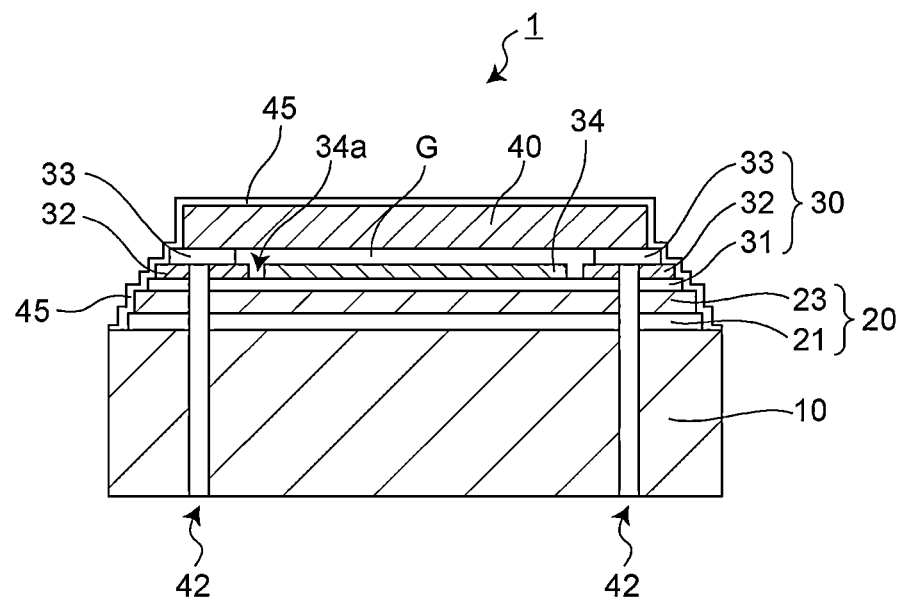
FIG. 14 is a sectional view illustrating an example of a pressure sensor structure according to Preferred Embodiment 12 of the present invention.

FIG. 14 is a sectional view illustrating an example of the pressure sensor structure 1 according to Preferred Embodiment 12 of the present invention. The present preferred embodiment is similar to the structure illustrated in FIGS. 2A and 2B. In the present preferred embodiment, however, at a location on the inner side of the edges of the guard substrate 10, for example, under the location of the sidewall layer 30, the groove 42 reaching the back surface of the guard substrate 10 is formed. With this, stress to be applied to the guard substrate 10 can be relaxed.

As an alternative example, the groove 42 may be provided in at least one of the guard substrate 10, the electrically insulating layer 21, the base conductive layer 23, the electrically insulating layer 31, the guard electrode layer 32, the electrically insulating layer 33, and the diaphragm plate 40. The groove 42 may, but not necessarily, be exposed to the outside.

Preferred Embodiment 13

Figure 15:
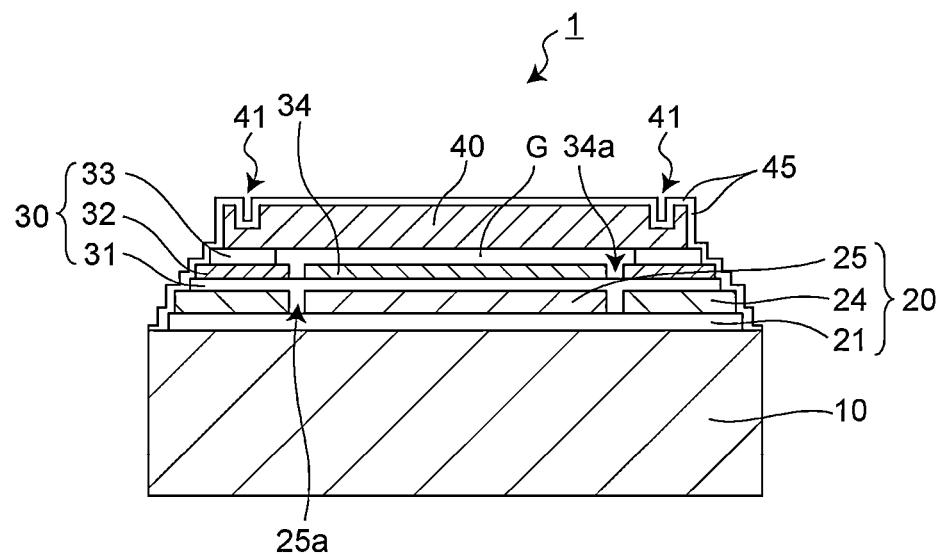
FIG. 15 is a sectional view illustrating an example of a pressure sensor structure according to Preferred Embodiment 13 of the present invention.

FIG. 15 is a sectional view illustrating an example of the pressure sensor structure 1 according to Preferred Embodiment 13 of the present invention. The present Preferred embodiment is similar to the structure illustrated in FIG. 3. In present preferred embodiment, however, at a location on the inner side of the edges of the diaphragm plate 40, for example, above the location of the sidewall layer 30, the groove 41 with a depth equivalent to about half the thickness of the diaphragm plate 40 is formed. With this, stress to be applied to the diaphragm plate 40 can be relaxed.

Preferred Embodiment 14

Figure 16:
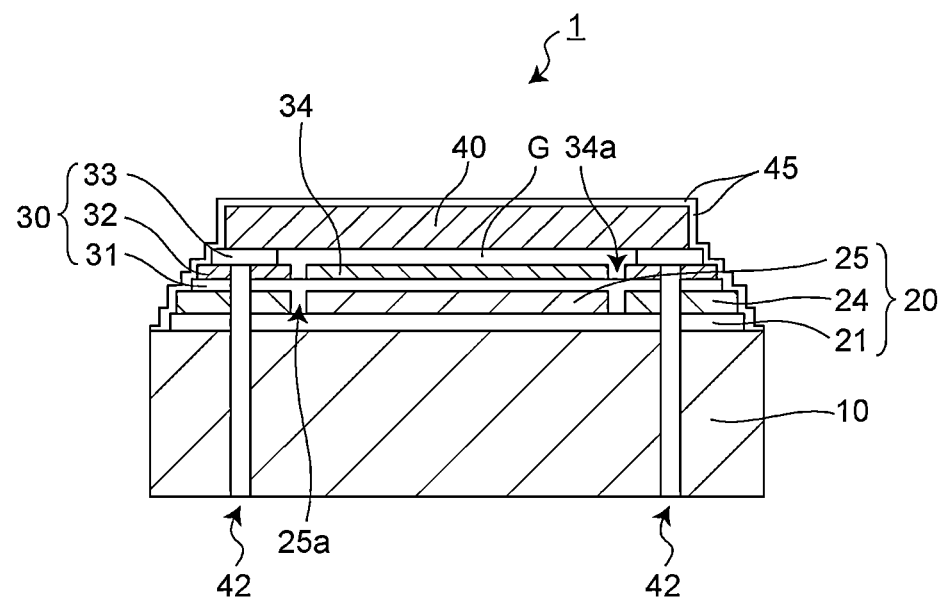
FIG. 16 is a sectional view illustrating an example of a pressure sensor structure according to Preferred Embodiment 14 of the present invention.

FIG. 16 is a sectional view illustrating an example of the pressure sensor structure 1 according to preferred Embodiment 14 of the present invention. The present preferred embodiment is similar to the structure illustrated in FIG. 3. In the present preferred embodiment, however, at a location on the inner side of the edges of the guard substrate 10, for example, under the location of the sidewall layer 30, the groove 42 reaching the back surface of the guard substrate 10 is provided. With this, stress to be applied to the guard substrate 10 can be relaxed.

As an alternative example, the groove 42 may be provided in at least one of the guard substrate 10, the electrically insulating layer 21, the second guard electrode layer 24, the electrically insulating layer 31, the guard electrode layer 32, the electrically insulating layer 33, and the diaphragm plate 40. The groove 42 may, but not necessarily, be exposed to the outside.

Preferred Embodiment 15

Figure 17:
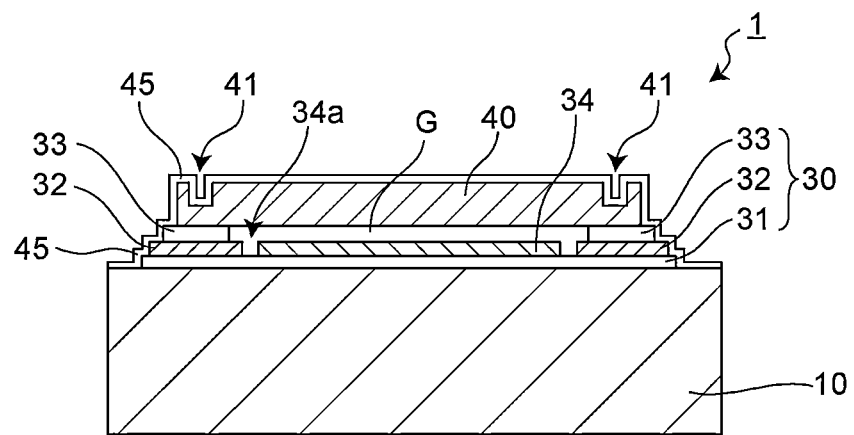
FIG. 17 is a sectional view illustrating an example of a pressure sensor structure according to Preferred Embodiment 15 of the present invention.

FIG. 17 is a sectional view illustrating an example of the pressure sensor structure 1 according to Preferred Embodiment 15 of the present invention. The present preferred embodiment is similar to the structure illustrated in FIG. 10. In present preferred embodiment, however, at a location on the inner side of the edges of the diaphragm plate 40, for example, above the location of the sidewall layer 30, the groove 41 with a depth equivalent to about half the thickness of the diaphragm plate 40 is provided. With this, stress to be applied to the diaphragm plate 40 can be relaxed.

Preferred Embodiment 16

Figure 18:
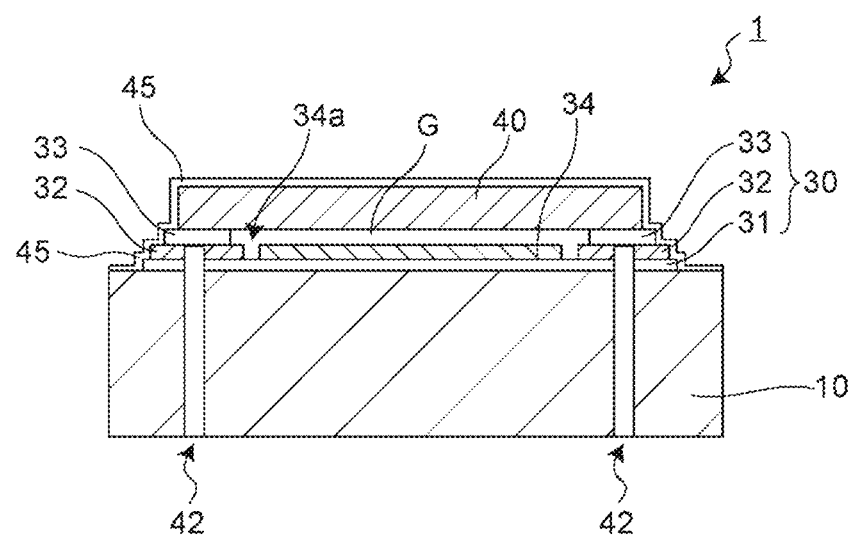
FIG. 18 is a sectional view illustrating an example of a pressure sensor structure according to Preferred Embodiment 16 of the present invention.

FIG. 18 is a sectional view illustrating an example of the pressure sensor structure 1 according to Preferred Embodiment 16 of the present invention. The present preferred embodiment is similar to the structure illustrated in FIG. 10. In the present preferred embodiment, however, at a location on the inner side of the edges of the guard substrate 10, for example, under the location of the sidewall layer 30, the groove 42 reaching the back surface of the guard substrate 10 is provided. With this, stress to be applied to the guard substrate 10 can be relaxed.

As an alternative example, the groove 42 may be provided in at least one of the guard substrate 10, the electrically insulating layer 31, the guard electrode layer 32, the electrically insulating layer 33, and the diaphragm plate 40. The groove 42 may, but not necessarily, be exposed to the outside.

Preferred Embodiment 17

Figure 19A:
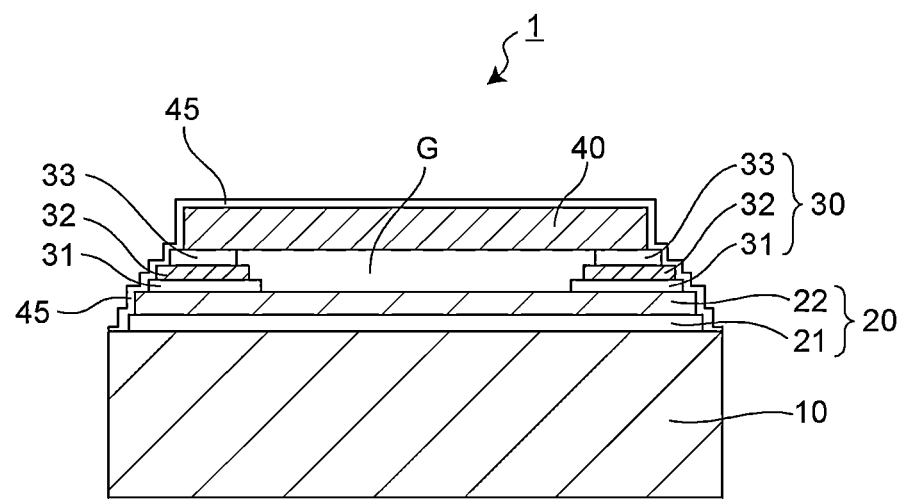
FIG. 19A is a sectional view illustrating an example of a pressure sensor structure according to Preferred Embodiment 17 of the present invention.
Figure 19B:
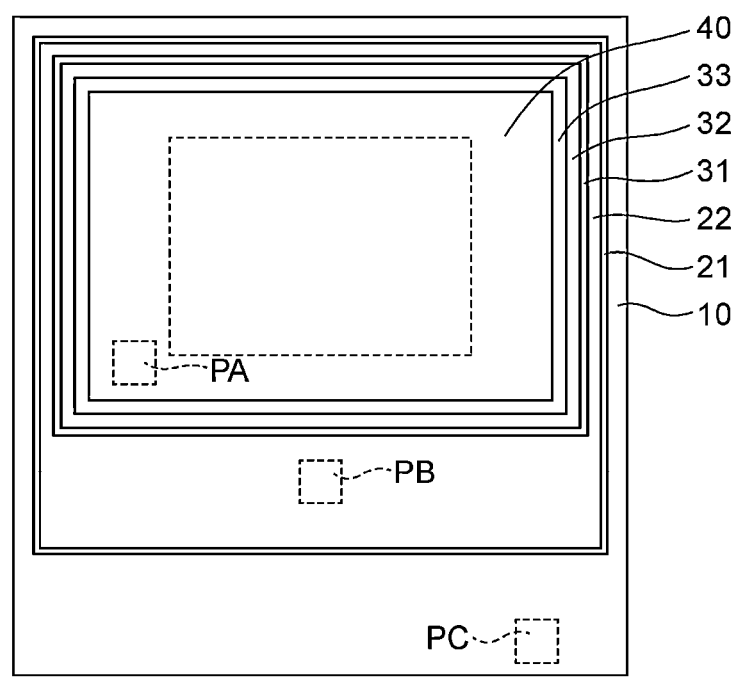
FIG. 19B is a plan view thereof.

FIG. 19A is a sectional view illustrating an example of the pressure sensor structure 1 according to Preferred Embodiment 17 of the present invention, and FIG. 19B is a plan view thereof. To promote a better understanding, the illustration of the passivation film is omitted in FIG. 19B. The present preferred embodiment is similar to the structure illustrated in FIG. 1. In the present preferred embodiment, however, the edges of the electrically insulating layer 21 and the base electrode 22 are laterally extended, the edges of the guard substrate 10 are laterally extended, and cavities are provided in the passivation film 45 placed on the upper surfaces of the diaphragm plate 40, the base electrode 22, and the guard substrate 10 to provide respective pad electrodes PA, PB, and PC. With this, the pad electrodes PA, PB, and PC are bonded to lead wires easily.

Preferred Embodiment 18

Figure 20A:
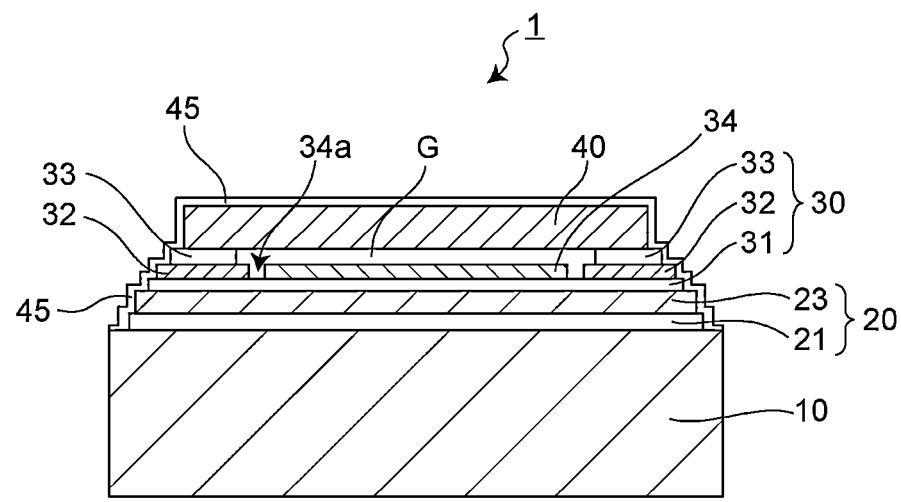
FIG. 20A is a sectional view illustrating an example of a pressure sensor structure according to Preferred Embodiment 18 of the present invention.
Figure 20B:
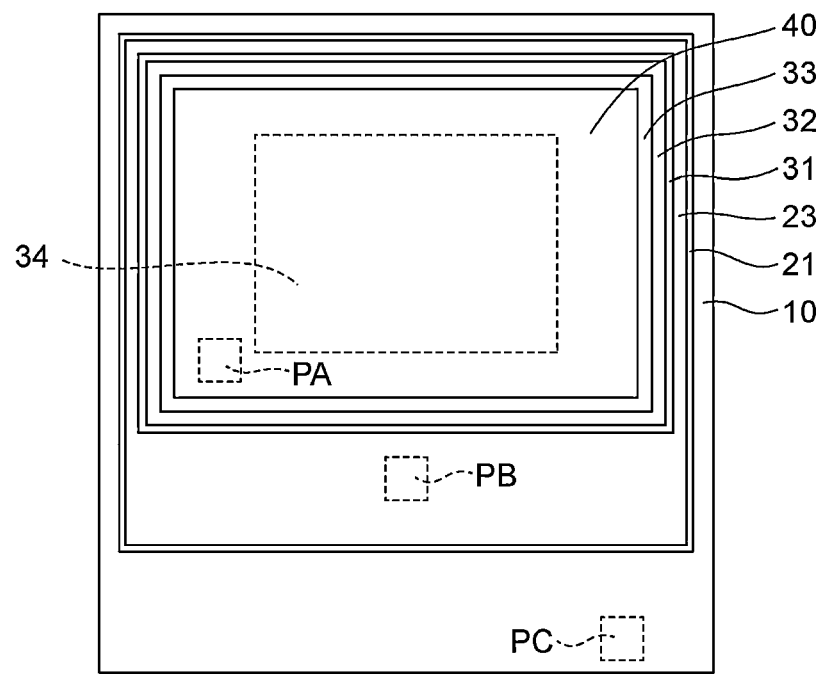
FIG. 20B is a plan view thereof.

FIG. 20A is a sectional view illustrating an example of the pressure sensor structure 1 according to Preferred Embodiment 18 of the present invention, and FIG. 20B is a plan view thereof. To promote a better understanding, the illustration of the passivation film is omitted in FIG. 20B. The present preferred embodiment is similar to the structure illustrated in FIGS. 2A and 2B. In the present preferred embodiment, however, the edges of the electrically insulating layer 21 and the base conductive layer 23 are laterally extended, the edges of the guard substrate 10 are laterally extended, and cavities are provided in the passivation film 45 placed on the upper surfaces of the diaphragm plate 40, the base conductive layer 23, and the guard substrate 10 to provide the respective pad electrodes PA, PB, and PC. With this, the pad electrodes PA, PB, and PC are bonded to lead wires easily.

Preferred Embodiment 19

Figure 21A:
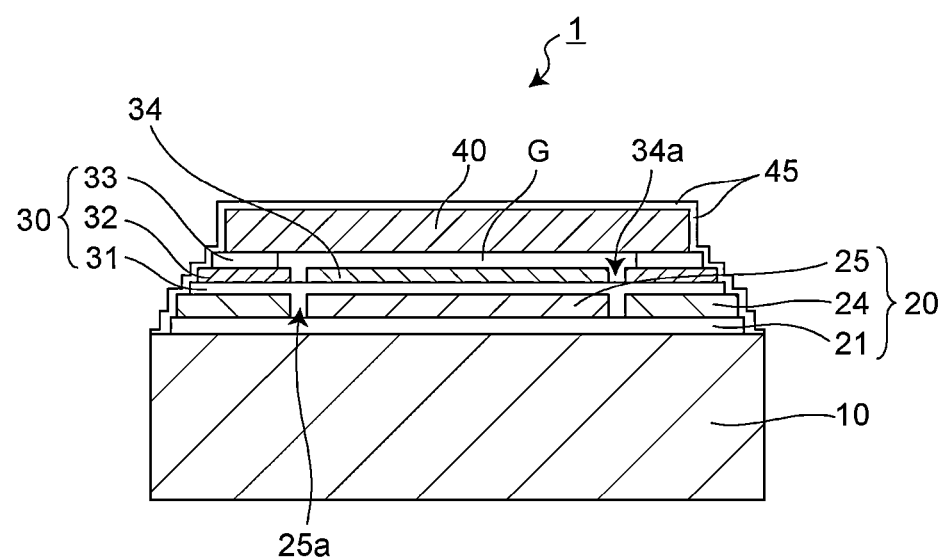
FIG. 21A is a sectional view illustrating an example of a pressure sensor structure according to Preferred Embodiment 19 of the present invention.
Figure 21B:
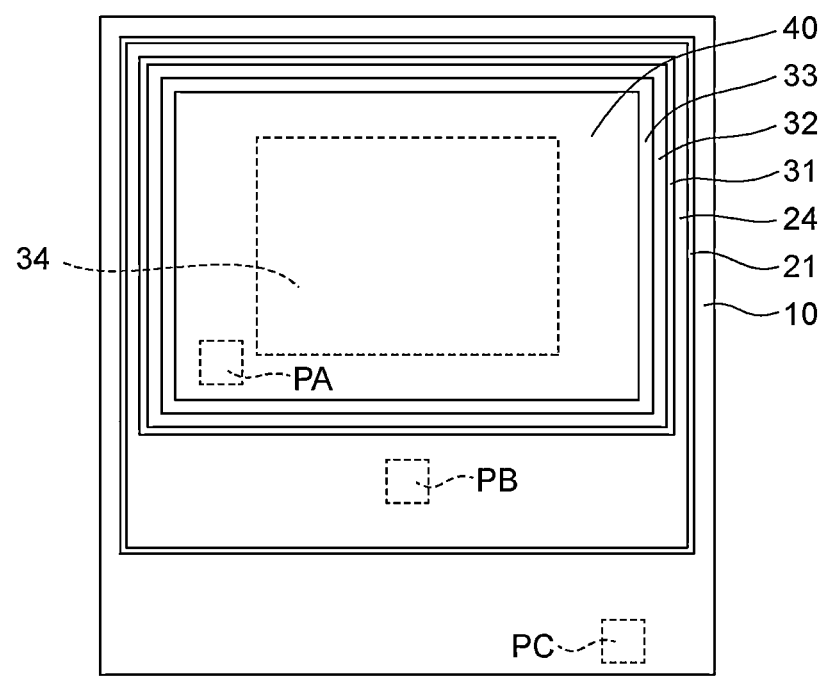
FIG. 21B is a plan view thereof.

FIG. 21A is a sectional view illustrating an example of the pressure sensor structure 1 according to Preferred Embodiment 19 of the present invention, and FIG. 21B is a plan view thereof. To promote a better understanding, the illustration of the passivation film is omitted in FIG. 21B. The present preferred embodiment is similar to the structure illustrated in FIG. 3. In the present preferred embodiment, however, the edges of the electrically insulating layer 21 and the second guard electrode layer 24 are laterally extended, the edges of the guard substrate 10 are laterally extended, and cavities are provided in the passivation film 45 placed on the upper surfaces of the diaphragm plate 40, the second guard electrode layer 24, and the guard substrate 10 to provide the respective pad electrodes PA, PB, and PC. With this, the pad electrodes PA, PB, and PC are bonded to lead wires easily.

Preferred Embodiment 20

Figure 22A:
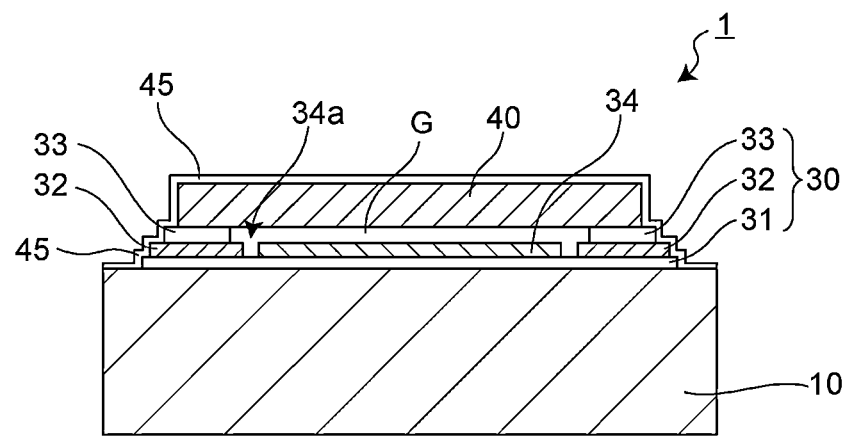
FIG. 22A is a sectional view illustrating an example of a pressure sensor structure according to Preferred Embodiment 20 of the present invention.
Figure 22B:
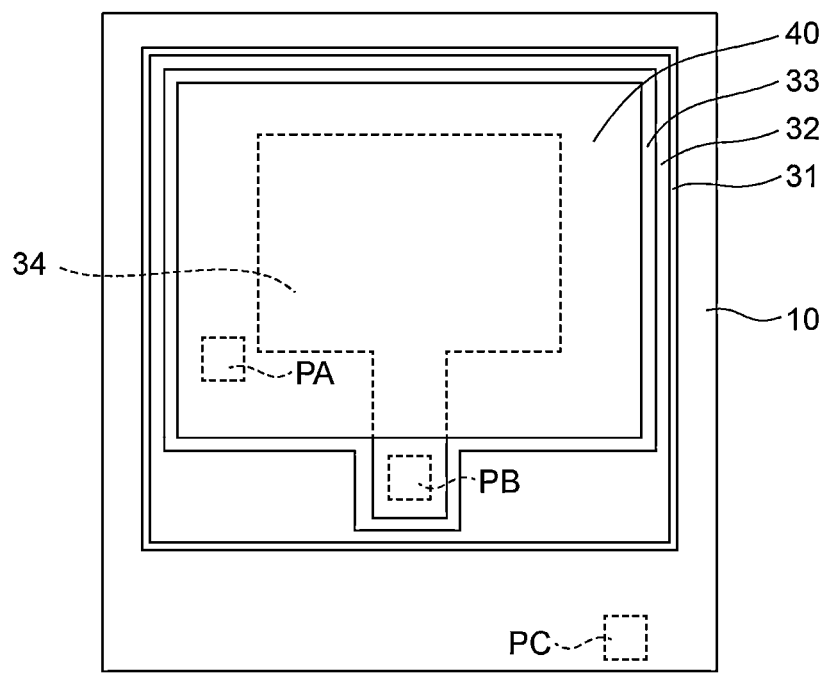
FIG. 22B is a plan view thereof.

FIG. 22A is a sectional view illustrating an example of the pressure sensor structure 1 according to Preferred Embodiment 20 of the present invention, and FIG. 22B is a plan view thereof. To promote a better understanding, the illustration of the passivation film is omitted in FIG. 22B. The present preferred embodiment is similar to the structure illustrated in FIG. 10. In the present preferred embodiment, however, a portion of the edge of the base electrode 34 and the edges of the guard electrode layer 32 are laterally extended, the edges of the guard substrate 10 are laterally extended, and cavities are provided in the passivation film 45 placed on the upper surfaces of the diaphragm plate 40, the base electrode 34, and the guard substrate 10 to provide the respective pad electrodes PA, PB, and PC. With this, the pad electrodes PA, PB, and PC are bonded to lead wires easily.

Next, the role of a guard electrode is described. In each preferred embodiment described above, the guard electrode layer 32 and the second guard electrode layer 24 preferably function as guard electrodes.

A guard electrode may be connected to a constant potential, and may preferably be connected to any of the ground of an electric circuit connected to the sensor, the virtual ground thereof, and another potential with which a current flowing between the diaphragm plate and the guard electrode and between the base electrode and the guard electrode and a current flowing between the diaphragm plate and the base electrode can be isolated from each other. In other words, a guard electrode may be used to prevent an electrical impedance between the diaphragm plate and the guard electrode and an electrical impedance between the base electrode and the guard electrode from affecting an electrostatic capacitance to be measured between the diaphragm plate and the base electrode.

FIG. 23 to FIG. 28 are circuit diagrams illustrating various examples of a capacitance converter circuit connectable to the sensor structure according to a preferred embodiment of the present invention. The capacitance converter circuits each include an operational amplifier OP, a base terminal TB for the base electrode, a diaphragm terminal TD for the diaphragm plate electrode, a guard terminal TG for the guard electrode, a voltage source CV or a current source CC, and a reference impedance RA. With the use of those capacitance converter circuits, a voltage output indicating an electrostatic capacitance between the diaphragm plate and the base electrode is obtained while the effects of disturbances are curbed.

FIG. 23 to FIG. 26 illustrate exemplary inverting operational amplifier circuits each including a positive non-inverting input connected to the common ground or a zero-voltage terminal. Since a closed-loop feedback circuit requires a differential input voltage of almost zero, the potential at the inverting input is equal or substantially equal to the potential at the non-inverting input so that a virtual ground point VG is generated.

Figure 23:
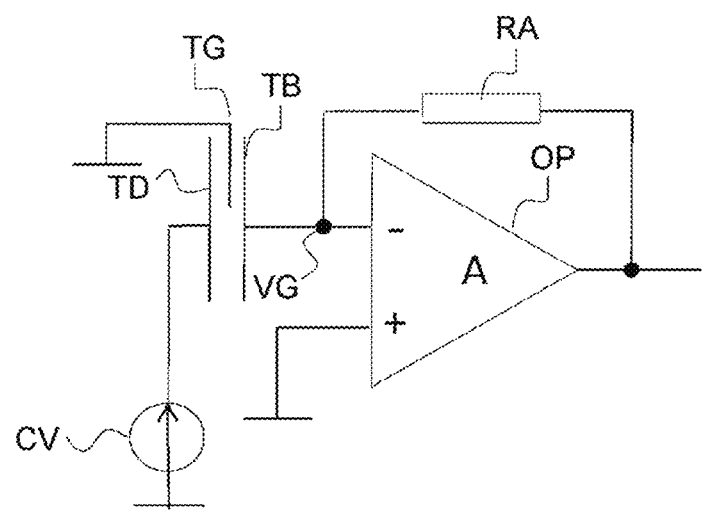
FIG. 23 is a circuit diagram illustrating an example of a capacitance converter circuit connectable to the sensor structure according to a preferred embodiment of the present invention.

In FIG. 23, the guard electrode is held at the same potential as the base electrode. As illustrated in FIG. 23, the base terminal TB is connected to the virtual ground point VG at the inverting input of the amplifier OP, and the guard terminal TG has the ground potential. Thus, voltage and current between the guard electrode and the base electrode are ignorable and thus have no substantial effect on a capacitance value to be measured between the base electrode and the diaphragm plate. The diaphragm terminal TD is connected to the voltage source CV to make a current between the guard electrode and the diaphragm plate ignorable and prevent the current from having a substantial effect on a capacitance value to be measured between the diaphragm plate and the base electrode. An electrostatic capacitance between the guard electrode and the base electrode is connected between the ground and the virtual ground point VG and thus has no substantial effect on a capacitance value to be measured between the diaphragm plate and the base electrode.

An electrostatic capacitance between the base terminal TB and the diaphragm terminal TD is denoted by $C_S$, and an electrostatic capacitance between the base terminal TB and the guard terminal TG is denoted by $C_L$. Further, the voltage source $C_V$ is assumed to be an AC voltage source of an effective voltage Ui, the feedback circuit element RA is assumed to be a capacitor having an electrostatic capacitance equal to $C_F$, and the open loop gain of the amplifier OP is assumed to be A. An output voltage Uo of the amplifier OP is represented as follows.

Formula 1

$$U_O = \frac{C_S}{C_L/A + C_F} U_i \quad (1)$$

In this way, the effect of $C_L$ is reduced depending on the amount of the open loop gain A of the amplifier. An electrostatic capacitance between the diaphragm terminal TD and the guard terminal TG is also connected to the voltage source Ui, which is an ideal voltage source capable of supplying a current to this electrostatic capacitance without a voltage change, in parallel and thus does not affect an output voltage either.

Figure 24:
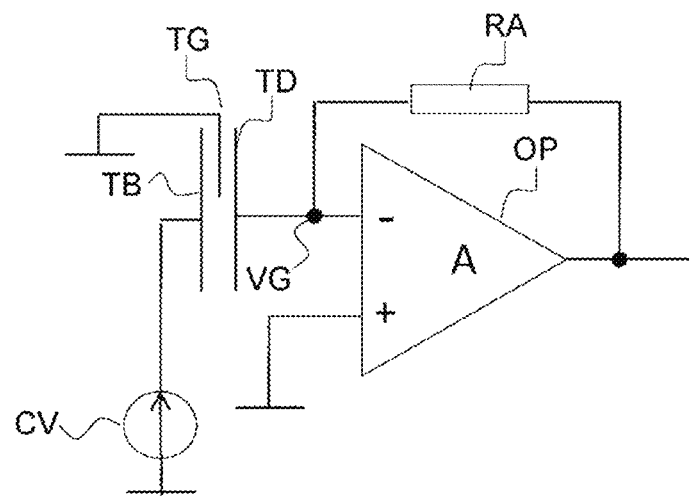
FIG. 24 is a circuit diagram illustrating an example of a capacitance converter circuit connectable to the sensor structure according to a preferred embodiment of the present invention.

Next, in FIG. 24, the guard electrode is held at almost the same potential as the diaphragm plate. As illustrated in FIG. 24, the diaphragm terminal TD is connected to the virtual ground point VG at the inverting input of the amplifier, and the guard terminal TG has the ground potential. Thus, voltage and current between the guard electrode and the diaphragm plate are ignorable and thus have no substantial effect on a capacitance value to be measured between the base electrode and the diaphragm plate. The base terminal TB is connected to the voltage source $C_V$ to prevent a current between the guard electrode and the base electrode from having a substantial effect on a capacitance value to be measured between the diaphragm plate and the base electrode. An electrostatic capacitance between the guard electrode and the base electrode is connected between the ground and the voltage source $C_V$ and thus has no substantial effect on a capacitance value to be measured between the diaphragm plate and the base electrode.

Figure 25:
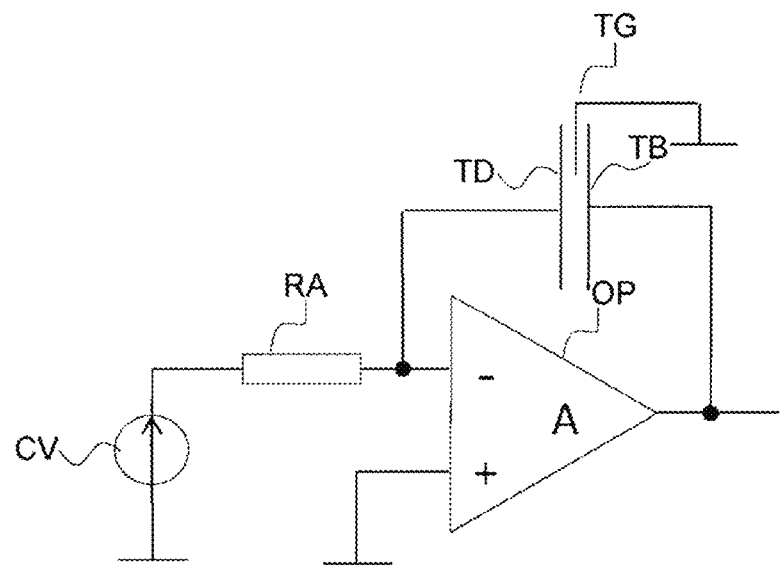
FIG. 25 is a circuit diagram illustrating an example of a capacitance converter circuit connectable to the sensor structure according to a preferred embodiment of the present invention.

Next, in FIG. 25, the guard electrode is held at almost the same potential as the diaphragm plate. As illustrated in FIG. 25, the diaphragm terminal TD is connected to the virtual ground point at the inverting input of the amplifier, and the guard terminal TG has the ground potential. Thus, voltage and current between the guard electrode and the diaphragm plate are ignorable and thus have no substantial effect on a capacitance value to be measured between the base electrode and the diaphragm plate. The base terminal TB is connected to the output of the amplifier OP to make a current between the guard electrode and the base electrode ignorable and prevent the current from having a substantial effect on a capacitance value to be measured between the diaphragm plate and the base electrode. An electrostatic capacitance between the guard electrode and the base electrode is connected between the ground and the output of the amplifier OP and thus has no substantial effect on a capacitance value to be measured between the diaphragm plate and the base electrode.

Figure 26:
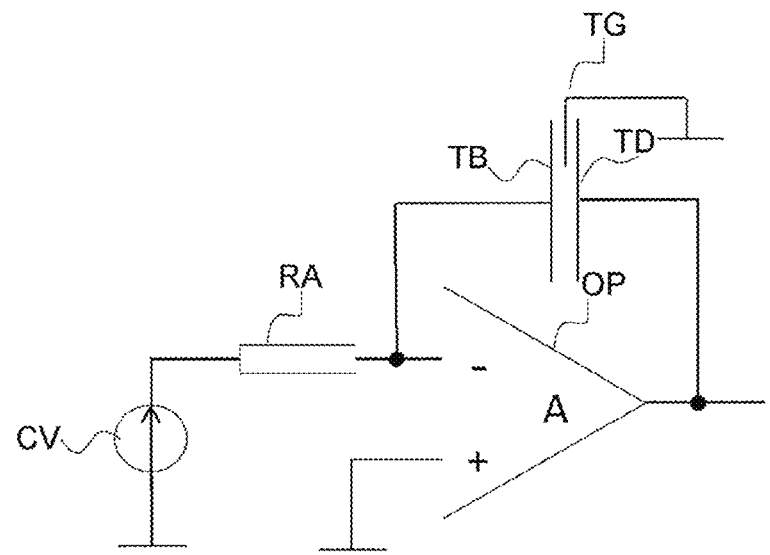
FIG. 26 is a circuit diagram illustrating an example of a capacitance converter circuit connectable to the sensor structure according to a preferred embodiment of the present invention.

Next, in FIG. 26, the guard electrode is held at almost the same potential as the base electrode. As illustrated in FIG. 26, the base terminal TB is connected to the virtual ground point at the inverting input of the amplifier, and the guard terminal TG has the ground potential. Thus, voltage and current between the guard electrode and the base electrode are ignorable and thus have no substantial effect on a capacitance value to be measured between the base electrode and the diaphragm plate. The diaphragm terminal TD is connected to the output of the amplifier OP to make a current between the guard electrode and the diaphragm plate ignorable and prevent the current from having a substantial effect on a capacitance value to be measured between the diaphragm plate and the base electrode. An electrostatic capacitance between the guard electrode and the base electrode is connected between the ground and the virtual ground point and thus has no substantial effect on a capacitance value to be measured between the diaphragm plate and the planar base.

In FIG. 23 to FIG. 26, the guard terminal TG is connected to the ground potential. The base terminal TB or the diaphragm terminal TD provides a sensed electrostatic capacitance, and one of the terminals of the sensor is connected to the virtual ground point of the amplifier circuit. With this, the guard terminal TG and one of the terminals of the sensor can be held at almost the same voltage while a current flowing through the guard terminal TG and a current flowing through the diaphragm terminal TD are isolated from each other.

Figure 27:
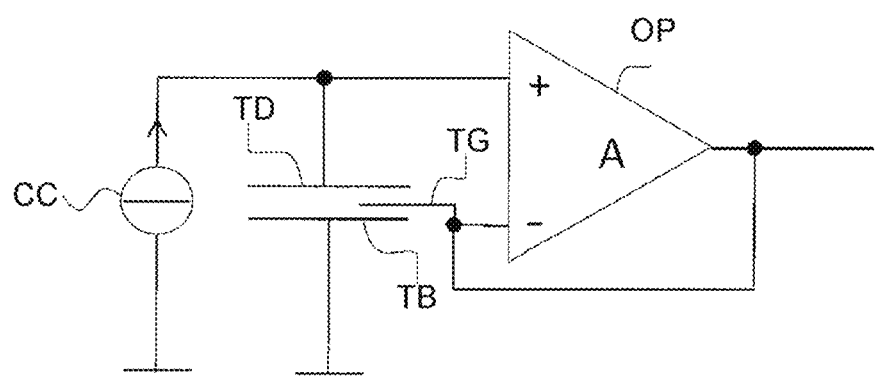
FIG. 27 is a circuit diagram illustrating an example of a capacitance converter circuit connectable to the sensor structure according to a preferred embodiment of the present invention.
Figure 28:
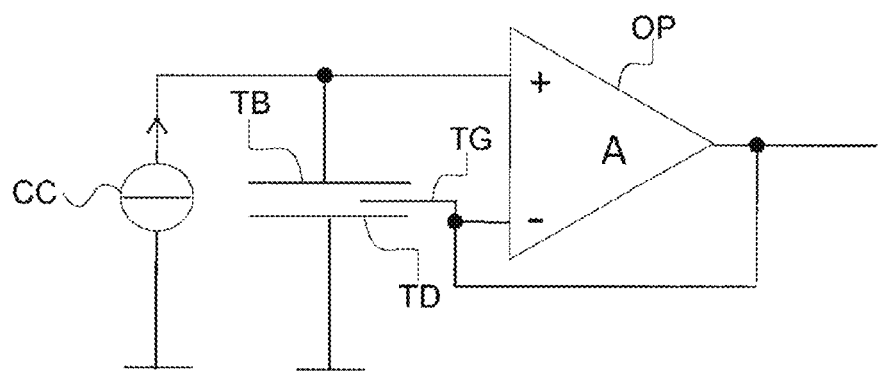
FIG. 28 is a circuit diagram illustrating an example of a capacitance converter circuit connectable to the sensor structure according to a preferred embodiment of the present invention.

FIG. 27 and FIG. 28 illustrate exemplary non-inverting operational amplifier circuits. The operational amplifier OP is used as a voltage follower, and the output of the operational amplifier OP is directly connected to the inverting input of the operational amplifier OP. The potential at the inverting input is equal or substantially equal to the potential at the non-inverting input.

In FIG. 27, the guard electrode is held at almost the same potential as the diaphragm plate. As illustrated in FIG. 27, the diaphragm terminal TD is connected to the current source CC with a current determined in advance or known. Further, it is understood that the current source CC may include a combination of a current source, a voltage source, and an internal impedance. In this case, the current is not constant but is known by a measurement with a shunt resistor or another known current measurement method, for example. Since the diaphragm plate and the guard electrode herein have the same or almost the same potential, substantially no current flows between the diaphragm plate and the guard electrode. A leakage or capacitive current may possibly be generated between the guard electrode and the base electrode, but since this current is provided by the amplifier OP without a substantial effect on an output voltage, the current also has no substantial effect on a voltage or current between the diaphragm plate and the base electrode.

An electrostatic capacitance between the base terminal TB and the diaphragm terminal TD is denoted by $C_S$, and an electrostatic capacitance between the inverting (−) input and non-inverting (+) input of the amplifier OP is denoted by $C_i$. This electrostatic capacitance includes both an input electrostatic capacitance of the amplifier OP and an electrostatic capacitance between the diaphragm terminal TD and the guard terminal TG. Further, the current source CC is assumed to be an AC source of an effective current $J_i$ at a frequency f, and the open loop gain of the amplifier OP is assumed to be A. An output voltage Uo of the amplifier is represented as follows.

Formula 2

$$U_O = \frac{1}{1 + \frac{C_i + C_S}{AC_S}} \frac{J_i}{2\pi f C_S} \quad (2)$$

In this way, the effect of $C_i$ is reduced depending on the amount of the open loop gain A of the amplifier. An electrostatic capacitance between the base terminal TB and the guard terminal TG is also connected between the output terminal of the amplifier and the ground terminal and thus has almost no effect on an output voltage. The electrostatic capacitance therefore does not affect an output voltage either.

In FIG. 28, the guard electrode is held at almost the same potential as the base electrode. As illustrated in FIG. 28, the base terminal TB is connected to the current source CC with a current determined in advance or known. Since the base electrode and the guard electrode herein have almost the same potential, substantially no current flows between the base electrode and the guard electrode. A leakage or capacitive current may possibly be generated between the guard electrode and the diaphragm plate, but since this current is provided by the amplifier without a substantial effect on an output voltage, the current has no substantial effect on a voltage or current between the diaphragm plate and the base electrode.

In FIG. 27 and FIG. 28, since the guard terminal TG is connected to the output of the amplifier OP to follow the potential at one of the terminals of the sensor, a current between the guard terminal TG and the terminal of the sensor is held at an ignorable value.

Although the present invention has been sufficiently described in terms of the preferred embodiments with reference to the accompanying drawings, various changes and modifications are apparent to those skilled in the art. It should be understood that such changes and modifications are included in the present invention without departing from the scope of the present invention according to the accompanying claims.

Preferred embodiments of the present invention can achieve pressure sensor structures capable of curbing the effects of disturbances and measuring pressure highly precisely and are thus industrially very useful.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure sensor structure to detect a change in interelectrode electrostatic capacitance, the pressure sensor structure comprising:
   a sensor body including:
      a diaphragm plate that functions as a sense electrode;
      a base electrode that faces the diaphragm plate; and
      a sidewall layer to maintain a gap between the diaphragm plate and the base electrode; and
   a conductive guard substrate to support the sensor body;
   wherein
   the sidewall layer includes a guard electrode layer and upper and lower guard electrode insulating layers to electrically insulate the guard electrode layer;
   the guard substrate is electrically connected to the guard electrode layer to function as a guard electrode together with the guard electrode layer;
   an electrically insulating layer to electrically insulate the guard substrate is between the guard substrate and the sensor body; and
   between the electrically insulating layer and the sensor body, a second base electrode and a second guard electrode layer are provided in a same layer and electrically isolated from each other.

2. The pressure sensor structure according to claim 1, wherein a passivation film is on an outer surface of each of the sensor body and the guard substrate.

3. The pressure sensor structure according to claim 1, wherein the base electrode is in a same layer as the guard electrode layer and electrically isolated from the guard electrode layer.

4. The pressure sensor structure according to claim 1, wherein at least one of the diaphragm plate, the upper guard electrode insulating layer, the guard electrode layer, the lower guard electrode insulating layer, and the guard substrate includes therein a groove to relax stress.

5. The pressure sensor structure according to claim 1, wherein
the lower guard electrode insulating layer has a plate shape larger than a contour of the diaphragm plate;
the guard electrode layer and the upper guard electrode insulating layer have a frame shape along a periphery of the diaphragm plate; and
a distance W6 between outer edges of the lower guard electrode insulating layer, a distance W2 between inner edges of the guard electrode layer, a distance W5 between outer edges thereof, a distance W3 between inner edges of the upper guard electrode insulating layer, and a distance W4 between outer edges thereof satisfy:

$W2<W3$ and $W4<W5<W6$.

6. The pressure sensor structure according to claim 1, wherein the upper and lower guard electrode insulating layers include silicon dioxide at least in part.

7. A pressure sensor device comprising:
a pressure sensor structure to detect a change in inter-electrode electrostatic capacitance;
an integrated circuit to process a signal from the pressure sensor structure;
a circuit substrate on which the integrated circuit and the pressure sensor structure are mounted; and
a case made of metal or a synthetic resin to accommodate the integrated circuit and the pressure sensor structure together with the circuit substrate; wherein
the pressure sensor structure includes:
a sensor body including:
a diaphragm plate that functions as a sense electrode;
a base electrode that faces the diaphragm plate; and
a sidewall layer to maintain a gap between the diaphragm plate and the base electrode; and
a conductive guard substrate to support the sensor body; wherein
the sidewall layer includes a guard electrode layer and upper and lower guard electrode insulating layers to electrically insulate the guard electrode layer;
the guard substrate is electrically connected to the guard electrode layer to function as a guard electrode together with the guard electrode layer;
an electrically insulating layer to electrically insulate the guard substrate is between the guard substrate and the sensor body; and
between the electrically insulating layer and the sensor body, a second base electrode and a second guard electrode layer are provided in a same layer and electrically isolated from each other.

8. The pressure sensor device according to claim 7, wherein a passivation film is on an outer surface of each of the sensor body and the guard substrate.

9. The pressure sensor device according to claim 7, wherein the base electrode is in a same layer as the guard electrode layer and electrically isolated from the guard electrode layer.

10. The pressure sensor device according to claim 7, wherein at least one of the diaphragm plate, the upper guard electrode insulating layer, the guard electrode layer, the lower guard electrode insulating layer, and the guard substrate includes therein a groove to relax stress.

11. The pressure sensor device according to claim 7, wherein
the lower guard electrode insulating layer has a plate shape larger than a contour of the diaphragm plate;
the guard electrode layer and the upper guard electrode insulating layer have a frame shape along a periphery of the diaphragm plate; and
a distance W6 between outer edges of the lower guard electrode insulating layer, a distance W2 between inner edges of the guard electrode layer, a distance W5 between outer edges thereof, a distance W3 between inner edges of the upper guard electrode insulating layer, and a distance W4 between outer edges thereof satisfy:

$W2<W3$ and $W4<W5<W6$.

12. The pressure sensor device according to claim 7, wherein the upper and lower guard electrode insulating layers include silicon dioxide at least in part.

* * * * *